(12) United States Patent
Suzuki et al.

(10) Patent No.: US 11,333,687 B2
(45) Date of Patent: May 17, 2022

(54) SENSOR UNIT

(71) Applicant: DENSO CORPORATION, Kariya (JP)

(72) Inventors: Yuuki Suzuki, Kariya (JP); Hiroyoshi Sawada, Kariya (JP); Kazuharu Tochikawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 211 days.

(21) Appl. No.: 16/903,726

(22) Filed: Jun. 17, 2020

(65) Prior Publication Data
US 2020/0400721 A1 Dec. 24, 2020

(30) Foreign Application Priority Data

Jun. 20, 2019 (JP) .............................. JP2019-114442
Jan. 27, 2020 (JP) .............................. JP2020-011053

(51) Int. Cl.
*H02P 27/08* (2006.01)
*G01R 15/20* (2006.01)
*H01R 25/16* (2006.01)

(52) U.S. Cl.
CPC ......... *G01R 15/205* (2013.01); *G01R 15/202* (2013.01); *H01R 25/16* (2013.01); *H02P 27/08* (2013.01); *H02P 2201/09* (2013.01)

(58) Field of Classification Search
CPC ..... H02P 27/08; G01R 15/202; G01R 15/205; H01R 25/16
See application file for complete search history.

(56) References Cited

U.S. PATENT DOCUMENTS

| 2015/0355241 | A1* | 12/2015 | Kawanami | ........... | G01R 15/205 |
| | | | | | 324/117 R |
| 2017/0003323 | A1* | 1/2017 | Nakayama | ............ | H02M 7/003 |
| 2017/0160313 | A1* | 6/2017 | Koiwa | ................. | G01R 15/207 |
| 2018/0031613 | A1* | 2/2018 | Nakayama | ............. | G01R 19/25 |

FOREIGN PATENT DOCUMENTS

JP 6350785 B2 7/2018

* cited by examiner

*Primary Examiner* — Rina I Duda
(74) *Attorney, Agent, or Firm* — Oliff PLC

(57) ABSTRACT

A sensor unit includes a bus bar and a magneto-electric conversion device. The bus bar connects a plurality of switch elements constituting a part of a power conversion circuit and a motor. The magneto-electric conversion device is disposed to face a middle portion of the bus bar across a clearance in a predetermined direction to detect a magnetic field caused by an electric current flowing through the bus bar, to thereby detects the electric current. The bus bar includes a first end and a second end. The first end of the bus bar is connected to one of a switch terminal extending from the switch elements and a motor terminal extending from the motor, and the second end of the bus bas is connected to the other of the switch terminal and the motor terminal.

6 Claims, 12 Drawing Sheets

SENSOR UNIT

CROSS REFERENCE TO RELATED APPLICATIONS

The present application claims the benefit of priority from Japanese Patent Applications No. 2019-114442 filed on Jun. 20, 2019 and No. 2020-011053 filed on Jan. 27, 2020. The entire disclosures of the above applications are incorporated herein by reference.

TECHNICAL FIELD

The present disclosure relates to a sensor unit including a bus bar that is connected to a switch and an electric motor, and a magneto-electric conversion device that detects an electric current flowing through the bus bar.

BACKGROUND

There is known an inverter that converts DC power from a battery into AC power and supplies the AC power to a motor. The inverter includes a bus bar through which an electric current to be measured flows and a current sensor arranged to face the bus bar.

SUMMARY

The present disclosure describes a sensor unit that includes a bus bar and a magneto-electric conversion device. The bus bar connects a plurality of switch elements constituting a part of a power conversion circuit and a motor. The magneto-electric conversion device is disposed to face a middle portion of the bus bar across a clearance in a predetermined direction to detect a magnetic field caused by an electric current flowing through the bus bar, to thereby detects the electric current. The bus bar includes a first end and a second end. The first end of the bus bar is connected to one of a switch terminal extending from the switch elements and a motor terminal extending from the motor, and the second end of the bus bas is connected to the other of the switch terminal and the motor terminal. The magneto-electric conversion device is located between the switch element and the motor terminal in a lateral direction that is orthogonal to the predetermined direction.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

Figure 1:
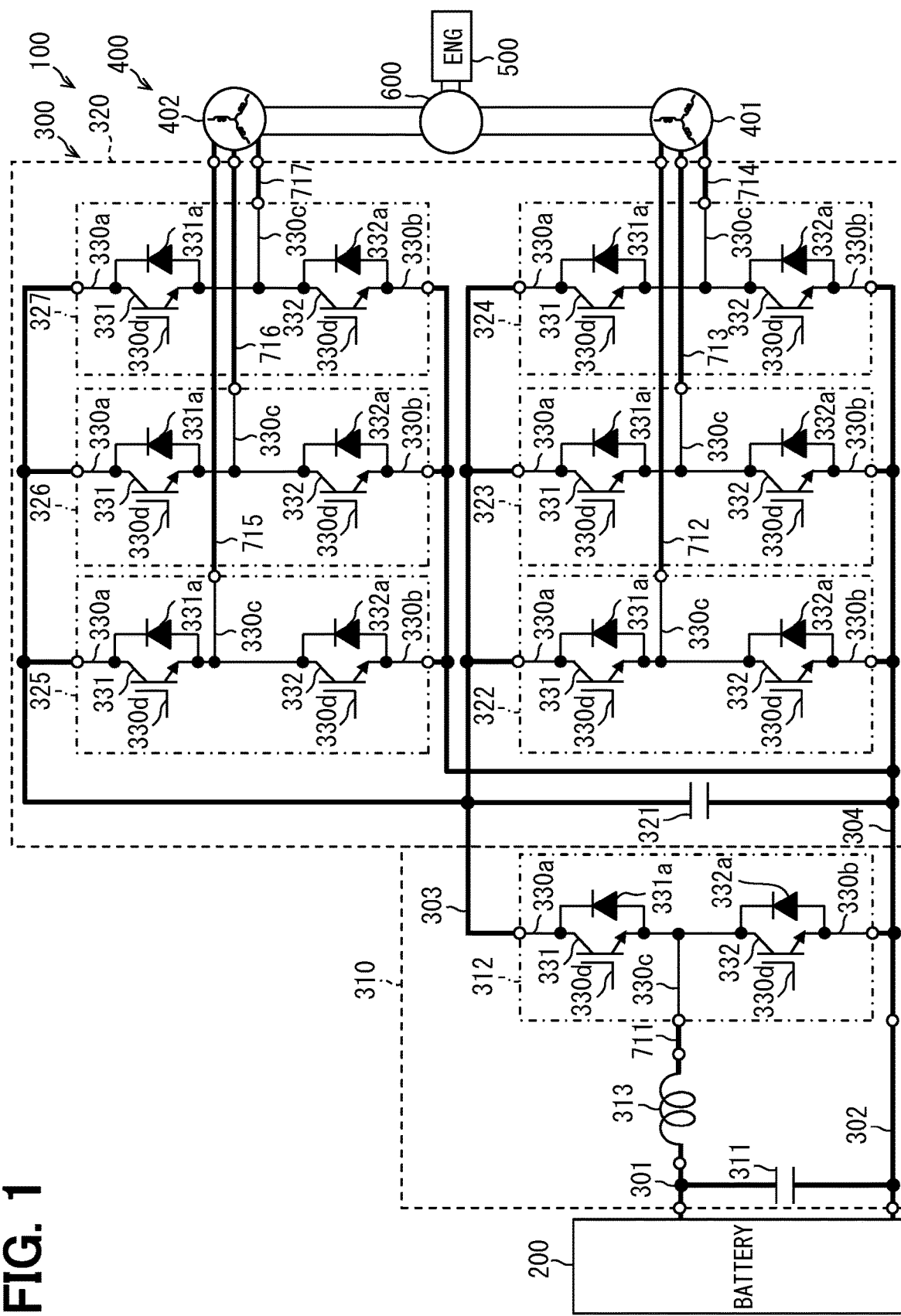
FIG. 1 is a circuit diagram for explaining an in-vehicle system according to a first embodiment.

In a case where a bus bar connects a switch element included in an inverter circuit and a stator coil of the motor, magnetic fields are generated from a conductive member that connects the bus bar and the switch element, and from a conductive member that connects the bus bar and the stator coil, respectively. If the magnetic fields pass through the current sensor, accuracy of current detection of the current sensor is likely to be degraded.

The present disclosure provides a sensor unit which is capable of suppressing the degradation of accuracy of the current detection.

According to an aspect of the present disclosure, a sensor unit includes a bus bar and a magneto-electric conversion device. The bus bar connects a plurality of switch elements constituting a part of a power conversion apparatus and a motor. The magneto-electric conversion device is disposed to face a middle portion of the bus bar across a clearance in a predetermined direction to detect a magnetic field caused by an electric current flowing through the bus bar, to thereby detects the electric current. The bus bar includes a first end and a second end. The first end of the bus bar is connected to one of a switch terminal extending from the switch elements and a motor terminal extending from the motor, and the second end of the bus bas is connected to the other of the switch terminal and the motor terminal. The magneto-electric conversion device is located between the switch element and the motor terminal in a lateral direction that is orthogonal to the predetermined direction. The one of the switch terminal and the motor terminal extends in a first direction that is along the predetermined direction and toward the magneto-electric conversion device from the middle portion of the bus bar. The other of the switch terminal and the motor terminal extends in a second direction that is along the predetermined direction and toward the middle portion of the bus bar from the magneto-electric conversion device.

In such a configuration, flow directions of the electric currents flowing in the switch terminal and the motor terminal are the same. Therefore, the magnetic field caused by the electric current flowing in the switch terminal and the magnetic field caused by the electric current flowing in the motor terminal are likely to be cancelled between the switch terminal and the motor terminal.

In addition, the magneto-electric conversion device is located between the switch terminal and the motor terminal in the lateral direction. As described above, the magnetic field caused by the electric current flowing in the switch terminal and the magnetic field caused by the electric current flowing in the motor terminal are likely to be cancelled between the switch terminal and the motor terminal. Therefore, the degradation of the current detection accuracy of the magneto-electric conversion device due to the magnetic fields generated from the switch terminal and the motor terminal can be suppressed.

Hereinafter, embodiments of the present disclosure will be described with reference to the drawings.

First Embodiment

In-Vehicle System

Firstly, an in-vehicle system 100 to which a sensor unit 700 is applied will be described with reference to FIG. 1. The in-vehicle system 100 constitutes a hybrid system.

The in-vehicle system 100 includes a battery 200, a power conversion apparatus 300, and a motor 400. Also, the in-vehicle system 100 includes an engine 500 and a power distribution mechanism 600. The power conversion apparatus 300 includes the sensor unit 700. The motor 400 includes a first motor generator (MG) 401 and a second motor generator (MG) 402. The motor 400 corresponds to an electric motor.

The in-vehicle system 100 further has a plurality of electric control units (ECUs). The plurality of ECUs transmit and receive signals to and from each other via bus wirings. The plurality of ECUs control a hybrid vehicle cooperatively. By the cooperative control of the plurality of ECUs, power running and power generation (regeneration) of the motor 400 according to a state of charge (SOC) of the battery 200, output of the engine 500, and the like are controlled.

The ECU includes at least one calculation processing unit (CPU) and at least one memory device (MMR) as a storage medium storing programs and data. The ECU includes a microcomputer having a computer readable storage medium. The storage medium is a non-transitory tangible storage medium that non-temporally stores a computer readable program. The storage medium may include a semiconductor memory, a magnetic disk, or the like. Hereinafter, components of the in-vehicle system 100 will be individually outlined.

The battery 200 includes a plurality of secondary batteries. The secondary batteries form a battery stack connected in series. Examples of the secondary battery include a lithium-ion secondary battery, a nickel-hydrogen secondary battery, and an organic radical battery.

The secondary battery generates an electromotive voltage by a chemical reaction. The secondary battery has a property that deterioration of which is accelerated when the charge amount is too large or too small. In other words, the secondary battery has a property that deterioration of which is accelerated when the SOC is in an overcharge or overdischarge state.

The SOC of the battery 200 corresponds to the SOC of the battery stack described above. The SOC of the battery stack is the sum of the SOCs of the plurality of secondary batteries. The overcharge and overdischarge of the SOC of the battery stack are avoided by the above-described cooperative control. On the other hand, the overcharge and overdischarge of the SOC of each of the plurality of secondary batteries are avoided by an equalization processing for equalizing the SOCs of the plurality of secondary batteries.

The equalization processing is performed by individually charging and discharging the plurality of secondary batteries. The battery 200 is provided with a monitoring unit that has a switch for individually charging and discharging the plurality of secondary batteries. Further, the battery 200 is provided with a voltage sensor and a temperature sensor for detecting the SOC of each of the plurality of secondary batteries. The plurality of ECUs includes one battery ECU that controls on and off of the switch based on the output of these sensors. Thus, the SOC of each of the secondary batteries is equalized. Note that the SOC can be detected using an output of a current sensor 730, which will be described later.

The power conversion apparatus 300 performs power conversion between the battery 200 and the first MG 401. The power conversion apparatus 300 also performs power conversion between the battery 200 and the second MG 402. The power conversion apparatus 300 converts DC power of battery 200 into AC power at a voltage level suitable for powering the first MG 401 and the second MG 402. The power conversion apparatus 300 converts the AC power generated by the power generation of the first MG 401 and the second MG 402 into DC power having a voltage level suitable for the charging battery 200. The power conversion apparatus 300 will be described later in detail.

The first MG 401, the second MG 402, and the engine 500 are respectively coupled to the power distribution mechanism 600. The first MG 401 generates electric power using rotation energy supplied from the engine 500. The AC power generated by this power generation is converted into DC power and stepped down by means of the power conversion apparatus 300. This DC power is supplied to battery 200. This DC power is also supplied to various electric loads mounted on the hybrid vehicle.

The second MG 402 is connected to an output shaft of the hybrid vehicle. The rotation energy of the second MG 402 is transmitted to travelling wheels via the output shaft. Conversely, the rotation energy of the travelling wheels is transmitted to the second MG 402 via the output shaft.

The second MG 402 runs by the AC power supplied from the power conversion apparatus 300. The rotation energy generated by this powering is distributed by the power distribution mechanism 600 to the engine 500 and the travelling wheels. As a result, cranking of the crankshaft and application of propulsion to the travelling wheels are performed. Further, the second MG 402 regenerates power by the rotation energy transmitted from the travelling wheels. The AC power generated by this regeneration is converted into DC power and stepped down by the power conversion apparatus 300. This DC power is supplied to the battery 200 and various electric loads.

The second MG 402 has a larger rated current than the first MG 401. The second MG 402 allows a larger amount of current to flow than in the first MG 401.

The engine 500 is driven by combustion of a fuel, to thereby generate the rotation energy. The rotation energy is distributed via the power distribution mechanism 600 to the first MG 401 and the second MG 402. As a result, the power generation of the first MG 401 and the application of the propulsion to the traveling wheels are enabled.

The power distribution mechanism 600 has a planetary gear mechanism. The power distribution mechanism 600 has a sun gear, a plurality of planetary gears, a planetary carrier, and a ring gear.

The sun gear and the planetary gear each have a disk shape. Each of the sun gear and the planetary gears has a plurality of teeth arranged on its circumferential wall in a circumferential direction.

The planetary carrier has a ring shape. The plurality of planetary gears are connected to a flat surface of the planetary carrier such that the flat surfaces of the planetary gears face the flat surface of the planetary carrier.

The plurality of planetary gears are located on a circumference centered on the rotation center of the planetary carrier. The planetary gears are arranged adjacent to each other at an equal interval. In the present embodiment, three planetary gears are arranged at the interval of 120 degrees (°).

The ring gear has a ring shape. The ring gear has a plurality of teeth, on its inner and outer circumferential surfaces, arranged in a circumferential direction.

The sun gear is provided at the center of the ring gear. The outer circumferential surface of the sun gear and the inner circumferential surface of the ring gear face each other. The three planetary gears are provided between the sun gear and the ring gear. The teeth of the three planetary gears respectively mesh with the teeth of the sun gear and the ring gear. Thus, the rotations of the sun gear, the planetary gears, the planetary carrier, and the ring gear can be transmitted to each other.

The motor shaft of the first MG 401 is connected to the sun gear. The crankshaft of the engine 500 is connected to the planetary carrier. The motor shaft of the second MG 402 is connected to the ring gear. Thus, the rotation speeds of the first MG 401, the engine 500, and the second MG 402 have a linear relationship in the alignment chart.

When the AC power is supplied from the power conversion apparatus 300 to the first MG 401 and the second MG 402, torques are generated in the sun gear and the ring gear. A torque is generated in the planetary carrier by the combustion drive of the engine 500. Thus, the power generation of the first MG 401, the power running and regeneration of the second MG 402, and the application of propulsion to the travelling wheels are performed.

The plurality of ECUs, which are described above, includes one MG-ECU, for example. The MG-ECU determines a target torque of each of the first MG 401 and the second MG 402 based on physical quantities detected by various sensors mounted on the hybrid vehicle and vehicle information input from another ECU. The MG-ECU performs vector control so that the torque generated in each of the first MG 401 and the second MG 402 becomes a target torque. This MG-ECU is mounted on a control circuit board 372 described later.

Circuit Configuration of Power Conversion Apparatus

Next, the power conversion apparatus 300 will be described. As shown in FIG. 1, the power conversion apparatus 300 includes, as components of a power conversion circuit, a converter 310 and an inverter 320. The converter 310 has the function of stepping up and down the voltage level of DC power. The inverter 320 has the function of converting DC power into AC power. The inverter 320 has the function of converting the AC power into the DC power.

The converter 310 steps up the DC power from the battery 200 to a voltage level suitable for generating the torques in the first MG 401 and the second MG 402. The inverter 320 converts this DC power into AC power. This AC power is supplied to the first MG 401 and the second MG 402. The inverter 320 converts the AC power generated by the first MG 401 and the second MG 402 into the DC power. The converter 310 steps down this DC power to a voltage level suitable for charging the battery 200.

As shown in FIG. 1, the converter 310 is electrically connected to the battery 200 via a positive electrode bus bar 301 and a negative electrode bus bar 302. The converter 310 is electrically connected to the inverter 320 via a P bus bar 303 and an N bus bar 304.

Converter

The converter 310 has, as electric elements, a filter capacitor 311, an A-phase switch module 312, and an A-phase reactor 313.

As shown in FIG. 1, one end of the positive electrode bus bar 301 is connected to a positive electrode of the battery 200. One end of the negative electrode bus bar 302 is connected to a negative electrode of the battery 200. One of two electrodes of the filter capacitor 311 is connected to the positive electrode bus bar 301. The other of the two electrodes of the filter capacitor 311 is connected to the negative electrode bus bar 302.

One end of the A-phase reactor 313 is connected to the other end of the positive electrode bus bar 301. The other end of the A-phase reactor 313 is connected to the A-phase switch module 312 via a first connection bus bar 711. As a result, the positive electrode of the battery 200 and the A-phase switch module 312 are electrically connected via the A-phase reactor 313 and the first connecting bus bar 711. In FIG. 1, the connecting portions of various bus bars are indicated by white circles. These connecting portions are electrically connected by, for example, bolts or welding.

The A-phase switch module 312 has a high-side switch 331 and a low-side switch 332. The A-phase switch module 312 has a high-side diode 331a and a low-side diode 332a. These semiconductor elements are covered and protected by a sealing resin (not shown).

In the present embodiment, n-channel IGBTs are used as the high-side switch 331 and the low-side switch 332. Terminals are respectively connected to a collector electrode, an emitter electrode and a gate electrode of each of the high-side switch 331 and the low-side switch 332, and ends of the terminals are exposed outside from the sealing resin described above.

As shown in FIG. 1, the emitter electrode of the high-side switch 331 and the collector electrode of the low-side switch 332 are connected to each other. Thus, the high-side switch 331 and the low-side switch 332 are connected in series.

A cathode electrode of the high-side diode 331a is connected to the collector electrode of the high-side switch 331. An anode electrode of the high-side diode 331a is connected to the emitter electrode of the high-side switch 331. Thus, the high-side diode 331a is connected in anti-parallel to the high-side switch 331.

Similarly, a cathode electrode of the low-side diode 332a is connected to the collector electrode of the low-side switch 332. An anode electrode of the low-side diode 332a is connected to the emitter electrode of the low-side switch 332. Thus, the low-side diode 332a is connected in anti-parallel to the low-side switch 332.

As described above, the high-side switch 331 and the low-side switch 332 are covered and protected by the sealing resin. From the sealing resin, the ends of the terminals, which are connected to the collector electrode and the gate electrode of the high-side switch 331, the midpoint between the high-side switch 331 and the low-side switch 332, and the emitter electrode and the gate electrode of the low-side switch 332, are exposed. Hereinafter, these terminals are indicated as a collector terminal 330a, a midpoint terminal 330c, an emitter terminal 330b, and a gate terminal 330d.

The collector terminal 330a is connected to the P bus bar 303. The emitter terminal 330b is connected to the N bus bar 304. Thus, the high-side switch 331 and the low-side switch 332 are connected in series and in order from the P bus bar 303 to the N bus bar 304.

Further, the midpoint terminal 330c is connected to the first connection bus bar 711. The first connection bus bar 711 is electrically connected to the positive electrode of the battery 200 via the A-phase reactor 313 and the positive electrode bus bar 301.

As described above, the DC power of the battery 200 is supplied to the midpoint of the two switches of the A-phase switch module 312 via the positive electrode bus bar 301, the A-phase reactor 313, and the first connecting bus bar 711. The AC power of the motor 400 is converted into the DC power by the inverter 320 and this DC power is supplied to the collector electrode of the high-side switch 331 of the A-phase switch module 312. The AC power of the motor 400 is converted into the DC power and this DC power is supplied to the battery 200 via the high-side switch 331, the first connection bus bar 711, the A-phase reactor 313 and the positive electrode bus bar 301.

As described above, the first connection bus bar 711 allows the DC power to be supplied to and from the battery 200. That is, as the physical quantity flowing therein, the DC power supplied to and from the battery 200 flows in the first connection bus bar 711.

The gate electrode 330d of each of the high-side switch 331 and the low-side switch 332 is connected to a gate driver. The MG-ECU generates a control signal and outputs the control signal to the gate driver. The gate driver amplifies the control signal and outputs the amplified control signal to the gate terminal 330d. Thus, on and off of the high-side switch 331 and the low-side switch 332 are controlled by the MG-ECU. As a result, the voltage level of the DC power input to converter 310 is stepped up and down.

The MG-ECU generates a pulse signal as the control signal. The MG-ECU controls the stepping up and stepping down levels of DC power by adjusting the on-duty ratio and the frequency of the pulse signal. The stepping up and stepping down levels are determined according to the target torque of the motor 400 and the SOC of the battery 200.

When stepping up the DC power of the battery 200, the MG-ECU alternately on and off each of the high-side switch 331 and the low-side switch 332. Conversely, when stepping down the DC power supplied from the inverter 320, the MG-ECU fixes the control signal to be output to the low-side switch 332 to a low level. At the same time, the MG-ECU sequentially switches the control signal to be output to the high-side switch 331 between a high level and a low level.

Inverter

The inverter 320 has, as electric elements, a smoothing capacitor 321, a discharge resistor (not shown), and U- to Z-phase switch modules 322 to 327.

One of the two electrodes of the smoothing capacitor 321 is connected to the P bus bar 303. The other of the two electrodes of the smoothing capacitor 321 is connected to the N bus bar 304. The discharge resistor is also connected to the P bus bar 303 and the N bus bar 304. The U- to Z-phase switch modules 322 to 327 are also connected to the P bus bar 303 and the N bus bar 304. The smoothing capacitor 321, the discharge resistor, and the U- to Z-phase switch modules 322 to 327 are connected in parallel between the P bus bar 303 and the N bus bar 304.

Each of the U- to Z-phase switch modules 322 to 327 has the similar components to those of the A-phase switch module 312. That is, each of the U- to Z-phase switch modules 322 to 327 includes a high-side switch 331, a low-side switch 332, a high-side diode 331a, a low-side diode 332a and a sealing resin. Further, each of these switch modules of the six phases includes a collector terminal 330a, an emitter terminal 330b, a midpoint terminal 330c, and a gate terminal 330d. The high-side switch 331 and the low-side switch 332 correspond to the switch elements.

The collector terminals 330a of these switch modules of the six phases are respectively connected to the P bus bar 303. The emitter terminals 330b of these switch modules of the six phases are respectively connected to the N bus bar 304.

The midpoint terminal 330c of the U-phase switch module 322 is connected to a U-phase stator coil of the first MG 401 via a second connection bus bar 712. The midpoint terminal 330c of the V-phase switch module 323 is connected to a V-phase stator coil of the first MG 401 via a third connection bus bar 713. The midpoint terminal 330c of the W-phase switch module 324 is connected to a W-phase stator coil of the first MG 401 via a fourth connection bus bar 714.

Similarly, the midpoint terminal 330c of the X-phase switch module 325 is connected to an X-phase stator coil of the second MG 402 via a fifth connection bus bar 715. The midpoint terminal 330c of the Y-phase switch module 326 is connected to a Y-phase stator coil of the second MG 402 via a sixth connection bus bar 716. The midpoint terminal 330c of the Z-phase switch module 327 is connected to a Z-phase stator coil of the second MG 402 via a seventh connection bus bar 717.

The gate terminal 330d of each of these switch modules of the six phases is connected to the gate driver described above. When powering each of the first MG 401 and the second MG 402, the high-side switch 331 and the low-side switch 332 of each of the switch modules of the six phases are PWM-controlled by outputting the control signal from the MG-ECU. Thus, three-phase alternating current is generated by inverter 320. When each of the first MG 401 and the second MG 402 generates (regenerates) power, the MG-ECU stops outputting the control signal, for example. Thus, the AC power generated by the power generation passes through the diodes of the switch modules of the six phases. As a result, the AC power is converted into the DC power.

As described above, the second to seventh connection bus bars 712 to 717, which connect the inverter 320 to the first MG 401 and the second MG 402, allow the AC power to flow to and from the first MG 401 and the second MG 402. That is, as the physical quantity flowing therein, the AC power flowing to and from the first MG 401 and the second MG 402 flows through the second to seventh connection bus bars 712 to 717.

The types of switch elements of each of the A-phase switch module 312 and the U- to Z-phase switch modules 322 to 327 are not particularly limited, and MOSFETs may also be adopted. Semiconductor elements such as the switch elements and the diodes of these switch modules can be manufactured using semiconductors such as Si and wide gap semiconductors such as SiC. The constituent material of the semiconductor element is not particularly limited.

Circuit Configuration of Power Conversion Apparatus

Next, the circuit configuration of the power conversion apparatus 300 will be described. Hereinafter, three orthogonal directions regarding the power conversion apparatus 300 are referred to as an X direction, a Y direction and a Z direction. The Y direction corresponds to a lateral direction, and the Z direction corresponds to a predetermined direction.

Figure 2:
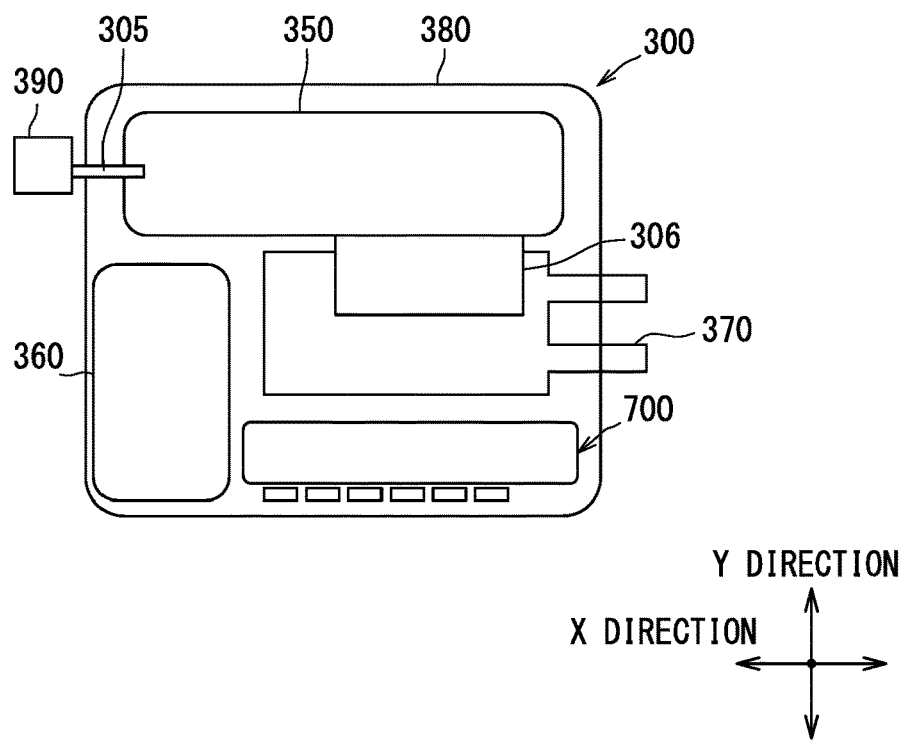
FIG. 2 is a schematic diagram for explaining a power conversion apparatus according to the first embodiment.
Figure 4:
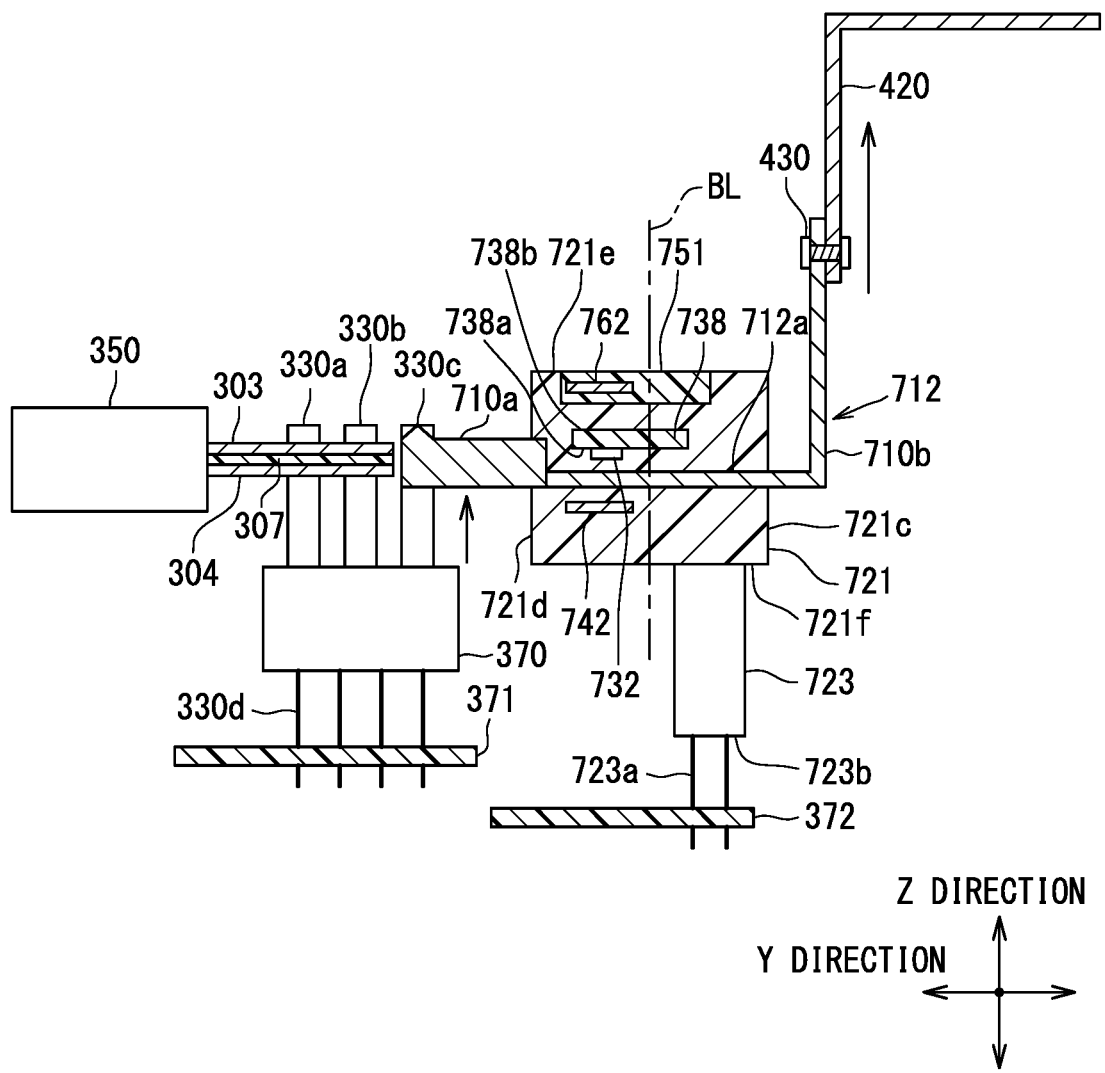
FIG. 4 is a schematic diagram illustrating an electrical connection of the power conversion apparatus.

The power conversion apparatus 300 has, in addition to the components of the power conversion circuit described above, a capacitor case 350, a reactor case 360, a cooler 370, a sensor unit 700, an inverter housing 380, and an input/output connector 390, as shown in FIG. 2. As shown in FIG. 4, the power conversion apparatus 300 has a driver board 371 and a control circuit board 372. At least one of the driver board 371 and the control circuit board 372 corresponds to a control board.

In FIG. 2, the positive electrode bus bar 301 and the negative electrode bus bar 302 are collectively indicated as an electrode bus bar 305. The ends of these two bus bars, that is, ends of the positive electrode bus bar 301 and the negative electrode bus bar 302 are provided in the input/output connector 390. A terminal of the wire harness is connected to the input/output connector 390. Thus, the battery 200 and the power conversion apparatus 300 are electrically connected via the wire harness.

In FIG. 2, the P bus bar 303 and the N bus bar 304 are collectively indicated as a PN bus bar 306. The P bus bar 303 and the N bus bar 304 are layered in the Z direction with an insulating sheet 307 interposed therebetween, as shown in FIG. 4.

Each of the capacitor case 350 and the reactor case 360 is made of an insulating resin material. The capacitor case 350 accommodates the filter capacitor 311 and the smoothing capacitor 321. The reactor case 360 accommodates the A-phase reactor 313. As shown in FIG. 4, a part of the P bus bar 303 is accommodated in the capacitor case 350 and a remaining part of the P bus bar 305 is located outside of the capacitor case 350. Likewise, a part of the N bus bar 304 is accommodated in the capacitor case 350, and a remaining part of the N bus bar 304 is located outside of the capacitor case 350.

The cooler 370 accommodates the switch modules of the converter 310 and the inverter 320. The cooler 370 has the function of cooling the switch modules of the converter 310 and the inverter 320. The cooler 370 accommodating the plural switch modules therein constitutes a power module.

The driver board 371 is provided with the gate driver described above. The control circuit board 372 is provided with the MG-ECU. Each of the driver board 371 and the control circuit board 372 has a thin plate shape defining a thickness in the Z direction. The driver board 371 and the control circuit board 372 can transmit signals to each other via a connector (not shown).

The sensor unit 700 has a terminal block 720 made of an insulating resin material. Portions of the above-described first to seventh connection bus bars 711 to 717 are insert-molded in this terminal block 720. The terminal block 720 is provided with a current sensor 730 that detects electric currents flowing through the first to seventh connection bus bars 711 to 717. The sensor unit 700 will be described in detail later.

The inverter housing 380 accommodates the capacitor case 350, the reactor case 360, the cooler 370, the driver board 371, the control circuit board 372, the sensor unit 700, and the input/output connector 390. The inverter housing 380 also accommodates the electrode bus bar 305 and the PN bus bar 306.

Figure 3:
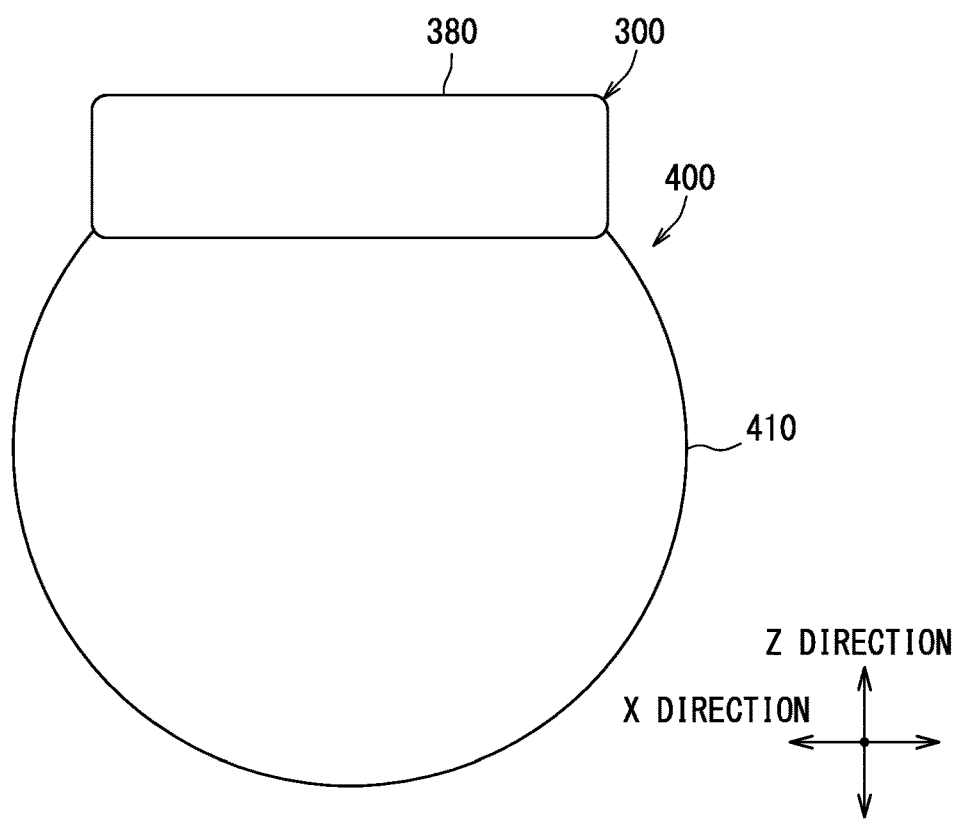
FIG. 3 is a schematic diagram illustrating a connection mode between the power conversion apparatus and a motor.

As shown in FIG. 3, the inverter housing 380 is connected to a motor housing 410 that accommodates the first MG 401 and the second MG 402 therein. The inverter housing 380 and the motor housing 410 are arranged side by side in the Z direction. As the power conversion apparatus 300 and the motor 400 are connected to each other, a so-called electro-mechanical integrated power conversion unit is configured.

As shown in FIG. 4, the capacitor case 350, which accommodates the part of the PN bus bar 306, and the sensor unit 700 are arranged size by side in the Y direction. The capacitor case 350 and the sensor unit 700 are arranged separately from the driver board 371 and the control circuit board 372 in the Z direction, respectively.

As described above, the PN bus bar 306 partly projects from the capacitor case 350 to the outside. Further, the connection bus bars 711 to 717 partly project from the terminal block 720 to the outside. The cooler 370 is located between the PN bus bar 306 and the driver board 371 in the Z direction. In addition, the cooler 370 is located between the connection bus bars 711 to 717 and the driver board 371 in the Z direction. In a direction connecting the cooler 370 and the terminal block 720, the parts of the connection bus bars 711 to 717 are located between the switch modules 312, 322 to 327 accommodated in the cooler 370 and the current sensor 730 provided in the terminal block 720.

As described above, the cooler 370 accommodates the seven switch modules 312, 322 to 327 in total of the converter 310 and the inverter 320. These switch modules 312, 322 to 327 each has the sealing resin, and the ends of the collector terminal 330*a*, the emitter terminal 330*b*, the midpoint terminal 330*c* and the gate terminal 330*d* are exposed from the sealing resin. Of these four terminals, the collector terminal 330*a* and the emitter terminal 330*b* extend in the Z direction toward the PN bus bar 306. The midpoint terminal 330*c* extends in the Z direction toward the connection bus bar. The gate terminal 330*d* extends in the Z direction, but in an opposite direction to the collector terminal 330*a*, the emitter terminal 330*b* and the midpoint terminal 330*c*, toward the driver board 371.

The collector terminal 330*a* is welded to the P bus bar 303. The emitter terminal 330*b* is welded to the N bus bar 304. The midpoint terminal 330*c* is welded to the connection bus bar included in the sensor unit 700. The gate terminal 330*d* is soldered to the driver board 371.

Further, as shown in FIG. 4, the sensor unit 700 and the control circuit board 372 are separated in the z direction. An output pin 723*a* of the sensor unit 700 extends toward the control circuit board 372. The output pin 723*a* is soldered to the control circuit board 372.

The connection bus bar is exposed from the terminal block 720 of the sensor unit 700. A first end 710*a* of the connection bus bar is connected to the above-mentioned midpoint terminal 330*c*. A second end 710*b* of the connection bus bar is connected to the stator coil of the MG through a stator bus bar 420. A connecting portion of the stator bus bar 420 with the connection bus bar extends so as to be separate from the control circuit board 372 and the sensor unit 700 in the z direction.

Sensor Unit

Next, the sensor unit 700 will be described in detail with reference to FIGS. 5 to 8. The sensor unit 700 includes the first connection bus bar 711 to the seventh connection bus bar 717, the terminal block 720, and the current sensor 730, as described above. Further, the sensor unit 700 has a shield (first shield) 740, a resin cover 750, and an opposing shield (second shield) 760, as shown in FIG. 8.

The current sensor 730 includes first to seventh magneto-electric conversion devices 731 to 737 of magnetic balance type, correspondingly to the seven connection bus bars 711 to 717, and a sensor substrate 738 having the seven magneto-electric conversion devices thereon. The shield 740 has a first shield member 741 to a seventh shield member 747, each made of a metal material having a higher magnetic permeability than the terminal block 720. The opposing shield 760 has a first opposing shield member 761 to a seventh opposing shield member 767, each made of a metal material having a magnetic permeability higher than that of the resin cover 750.

Each of the first to seventh connection bus bars 711 to 717 is insert-molded in the terminal block 720. The first to seventh magneto-electric conversion devices 731 to 737 are provided in the terminal block 720 so as to face the portions of the first to seventh connection bus bars 711 to 717, which are insert-molded in the terminal block 720, in the z direction.

The first to seventh shield members 741 to 747 are insert-molded in the terminal block 720. The first to seventh opposing shield members 761 to 767 are insert-molded in the resin cover 750. The resin cover 750 is provided on the terminal block 720 in such a manner that the seven shield members 741 to 747 and the seven opposing shield members 761 to 767 are correspondingly arranged side by side, but separated from each other in the Z direction.

Between one shield member and corresponding one opposing shield member, an insert-molded portion of one connection bus bar, which is insert-molded in the terminal block 720, and one magneto-electric conversion device are located. This arrangement suppresses the input of external noise to the magneto-electric conversion device. The distribution of the magnetic field (measurement magnetic field to be measured) generated from the current flowing through the insert-molded portion of the connection bus bar, which is insert-molded in the terminal block 720, is regulated. Fluctuations in the direction of the measurement magnetic field that passes through the magneto-electric conversion device are suppressed. Hereinafter, components of the sensor unit 700 will be individually described.

Connection Bus Bar

The first to seventh connection bus bars 711 to 717 are each made of a metal material, such as copper or aluminum, having a higher rigidity than the terminal block 720. The first to seventh connection bus bars 711 to 717 are each produced by pressing a flat metal plate. A middle portion of each of the first to seventh connection bus bars 711 to 717 is insert-molded in the terminal block 720. A first end 710a and a second end 710b of each of the first to seventh connection bus bars 711 to 717 are exposed from the terminal block 720.

The midpoint terminal 330c of the switch module is joined to the first end 710a of each of the first to seventh connection bus bars 711 to 717, the first end 710a exposing from the terminal block 720. The A-phase reactor 313 is joined to the second end 710b of the first connection bus bar 711. The stator bus bar 420 of the motor 400 is joined to the second end 710b of each of the second to seventh connection bus bars 712 to 717. As a result, the current flows from the switch modules 322 to 327 to the stator bus bars 420 via the connection bus bars 712 to 717. Also, the current flows from the stator bus bars 420 to the switch modules 322 to 327 via the connection bus bars 712 to 717.

Terminal Block

The terminal block 720 has a base portion 721, flange portions 722, and a connector portion 723, which are described in detail. The base portion 721, the flange portions 722, and the connector portion 723 are integrally connected by the resin material forming the terminal block 720.

The base portion 721 has a substantially rectangular parallelepiped shape having a longitudinal direction in the X direction. The base portion 721 has a left surface 721a and a right surface 721b facing in the X direction. The base portion 721 has a front surface 721c and a rear surface 721d facing in the Y direction. The base portion 721 has an upper surface 721e and a lower surface 721f facing in the Z direction.

Figure 5:
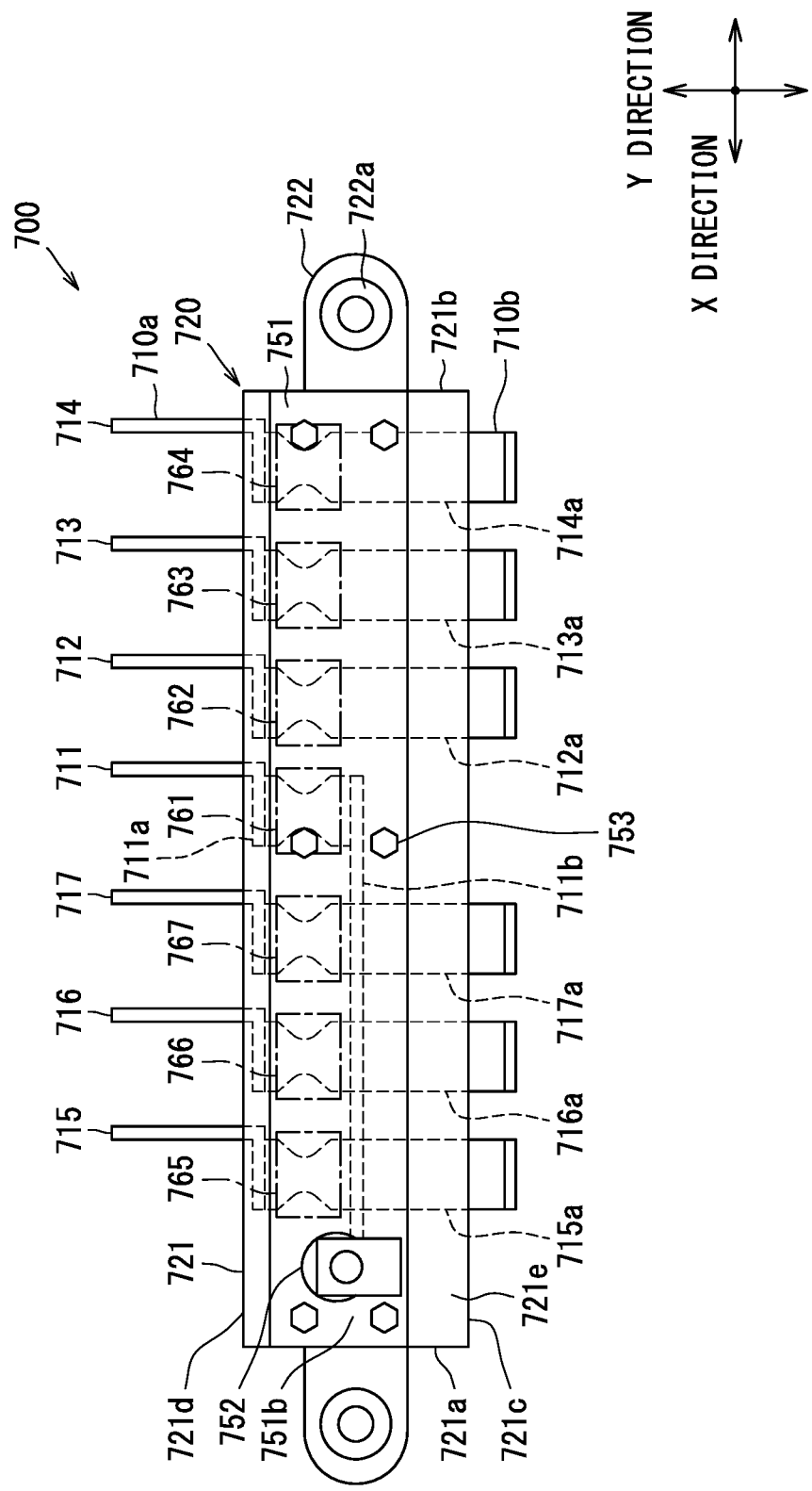
FIG. 5 is a diagram illustrating a top view of a sensor unit of the power conversion apparatus.

As shown in FIGS. 3 to 5, the flange portions 722 are integrally connected to the left surface 721a and the right surface 721b of the base portion 721. One of the two flange portions 722 projects from the left surface 721a in the X direction so as to separate from the left surface 721a. The other of the two flange portions 722 projects from the right surface 722a in the X direction so as to separate from the right surface 721b.

A metal collar 722a is insert-molded in each of the two flange portions 722. The collar 722a has an annular shape defining an opening in the Z direction. A bolt is inserted into the opening of the collar 722a. The tip of the bolt is fastened with the inverter housing 380. As a result, the sensor unit 700 is fixed to the inverter housing 380.

As shown in FIGS. 4 and 5, the connector portion 723 is integrally connected to the lower surface 721f of the base portion 721. The connector portion 723 extends in the Z direction so as to separate from the lower surface 721f.

A plurality of output pins 723a are insert-molded in the connector portion 723. The output pins 723a extend in the Z direction. A first end of each of the output pins 723a exposes from the end surface 723b of the connector portion 723. The first end of each of the output pins 723a is soldered to the control circuit board 372. A second end of each of the output pins 723a exposes from the upper surface 721e of the base portion 721. The second end of each of the output pins 723a is soldered to the sensor substrate 738.

Figure 6:
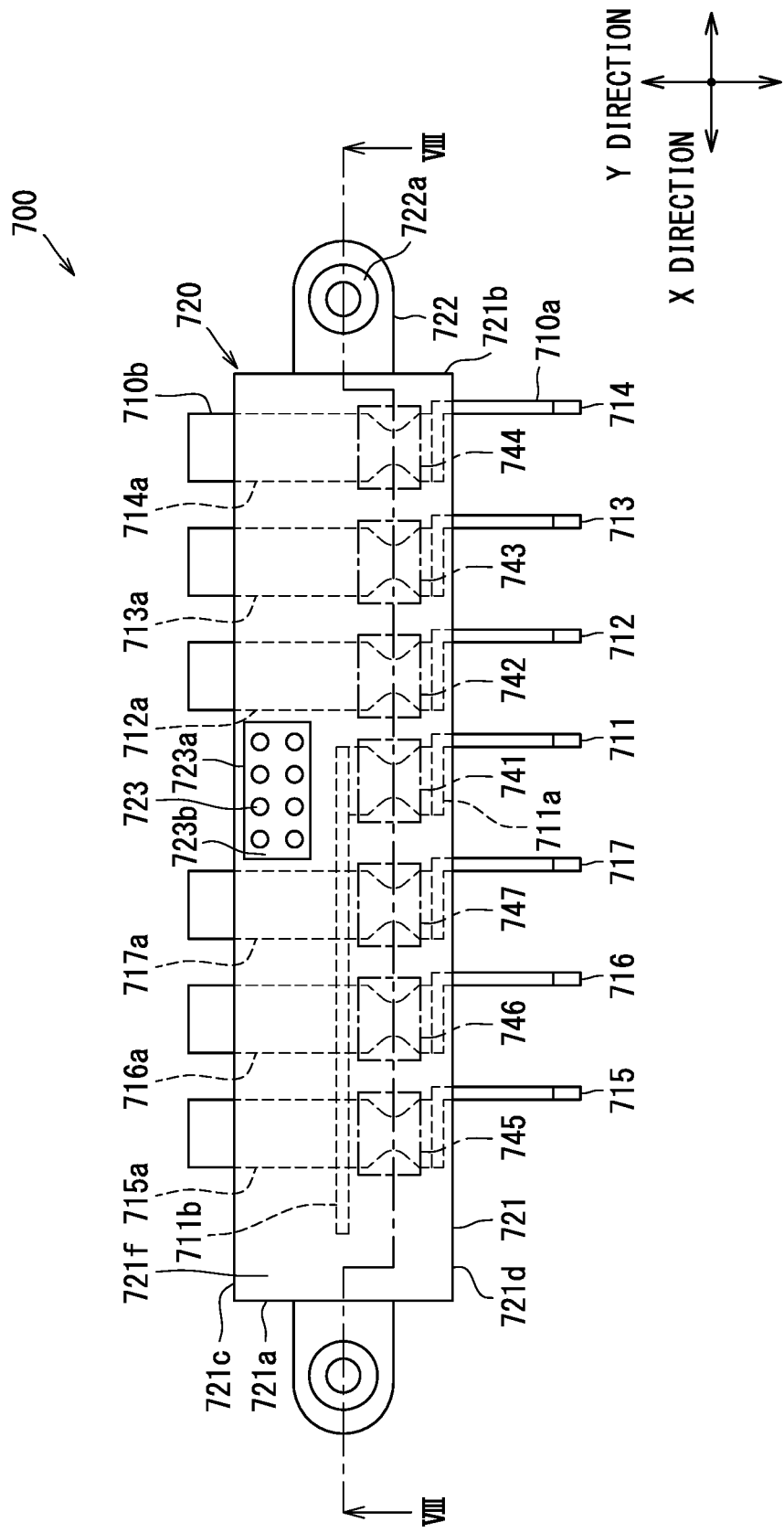
FIG. 6 is a diagram illustrating a bottom view of the sensor unit.
Figure 7:
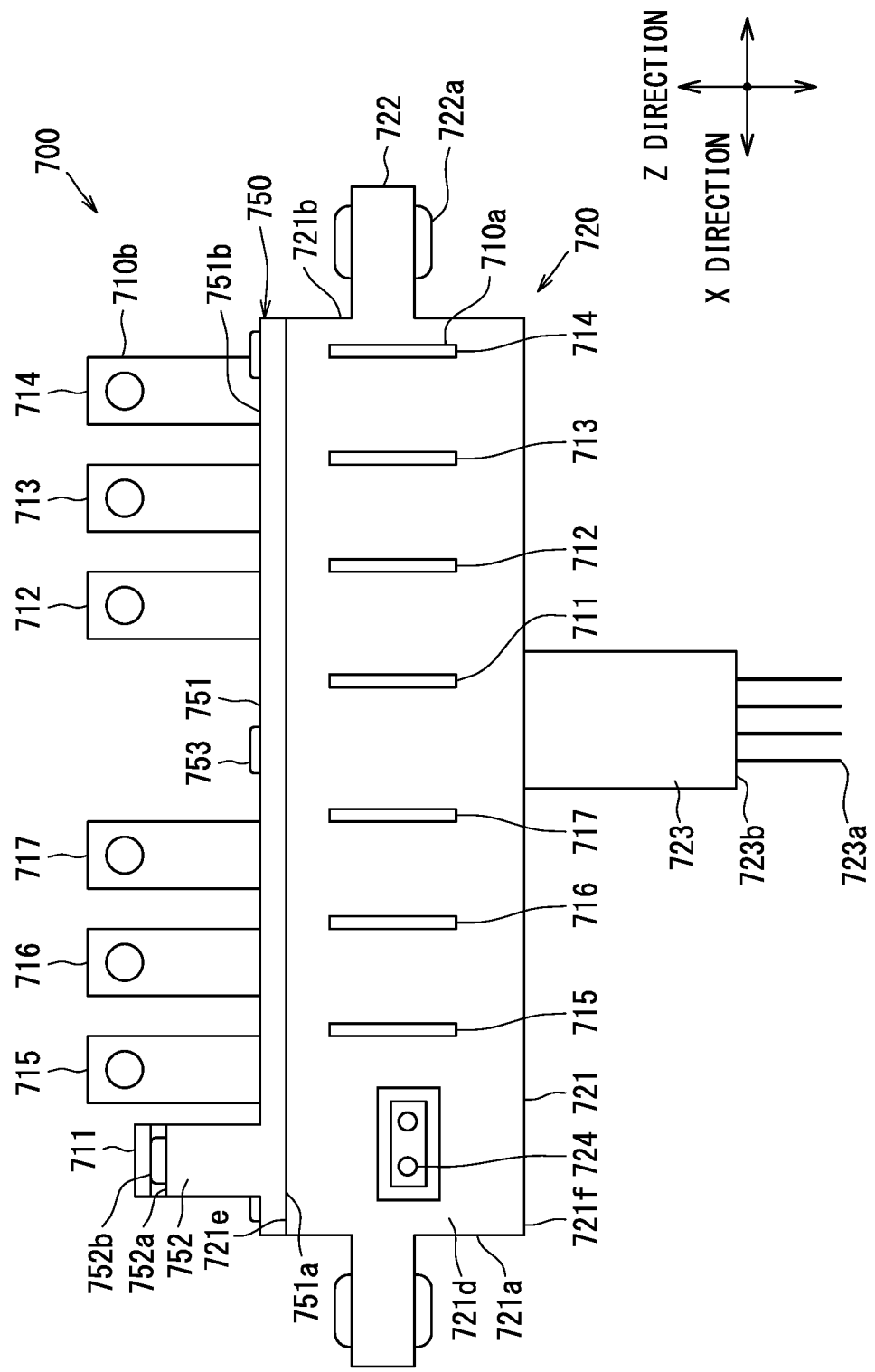
FIG. 7 is a diagram illustrating a plan view of the sensor unit.
Figure 8:
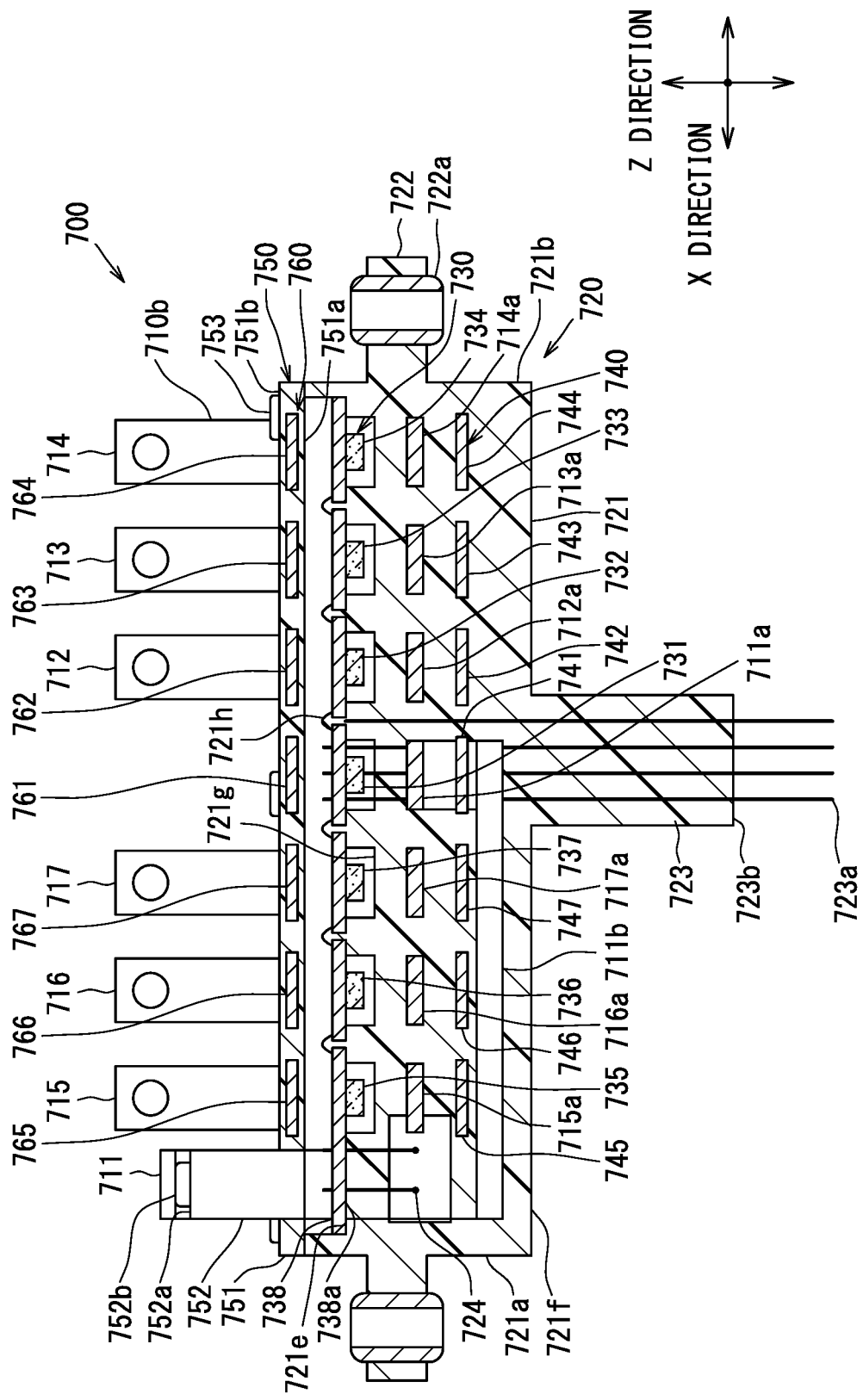
FIG. 8 is a diagram illustrating a cross section of the sensor unit taken along a line VIII-VIII in FIG. 6.

As shown in FIGS. 5 to 7, the middle portions of the first to seventh connection bus bars 711 to 717 are insert-molded in the base portion 721. The first ends 710a of the first to seventh connection bus bars 711 to 717 project from the rear surface 721d of the base portion 721. The first ends 710a of the first to seventh connection bus bars 711 to 717 are arranged in the X direction, and are spaced from each other in the X direction. In the X direction from the left surface 721a toward the right surface 721b, the seven first ends 710a of the first to seventh connection bus bars 711 to 717 are arranged in an order of the first connection bus bar 715, the sixth connection bus bar 716, the seventh connection bus bar 717, the first connection bus bar 711, the second connection bus bar 712, the third connection bus bar 713, and the fourth connection bus bar 714.

The first end 710a has a thin flat shape having a thickness in the X direction. The first end 710a has a connection surface facing in the X direction. The midpoint terminal 330c is arranged to oppose and to be in contact with the connection surface of the first end 710a in the X direction. The first end 710a and the midpoint terminal 330c are irradiated with laser in the Z direction. As a result, the connection bus bar and the midpoint terminal 330c are welded and joined to each other. The midpoint terminal 330c extends in the Z direction from the lower surface 721f toward the upper surface 721e so as to approach the terminal block 720.

Of the seven connection bus bars 711 to 717 insert-molded in the base portion 721, the middle portions of the second to seventh connection bus bars 712 to 717 each extend in the Y direction. The second ends 710*b* of the second to seventh connection bus bars 712 to 717 project from the front surface 721*c* of the base portion 721. The second ends 710*b* of the second to seventh connection bus bars 712 to 717 are arranged in the X direction and are spaced from each other in the X direction. Specifically, in the X direction from the left surface 721*a* toward the right surface 721*b*, the second ends 710*b* of the six connection bus bars 712 to 717 are arranged in an order of the fifth connection bus bar 715, the sixth connection bus bar 716, the seventh connection bus bar 717, the second connection bus bar 712, the third connection bus bar 713, and the fourth connection bus bar 714.

The second ends 710*b* of the second to seventh connection bus bars 712 to 717 extend in the Y direction so as to separate from the front surface 721*c*, and then bend in the Z direction so as to extend in the Z direction from the lower surface 721*f* toward the upper surface 721*e*. The stator bus bars 420 of the motor 400 are fastened to the second ends 710*b* of the second to seventh connection bus bars 712 to 717 by bolts 430. Thus, the connection bus bars 712 to 717 and the stator bus bars 420 are connected to each other. The connecting portions of the stator bus bars 420 with the connection bus bars 712 to 717 extend in the Z direction directing from the lower surface 721*f* toward the upper surface 721*e* so as to separate from the terminal block 720.

The middle portion of the first connection bus bar 711 is insert-molded in the base portion 721, and a side of the middle portion adjacent to the first end 710*a* extends in the Y direction, similarly to the middle portions of the second to seventh connection bus bars 712 to 717. However, as shown in FIG. 8, the middle portion of the first connection bus bar 711 extends in the Y direction directing from the rear surface 721*d* toward the front surface 721*c*, and then bends in the Z direction directing toward the lower surface 721*f*. The middle portion of the first connection bus bar 711 further bends in the X direction, extends toward the left surface 721*a*, and further bends in the Z direction to extend toward the upper surface 721*e*. Note that, in FIG. 8, in order to explain the shape of the middle portion of the above-mentioned first connection bus bar 711, an extending portion 711*b* of the first connection bus bar 711, which is not originally on the line VIII-VIII in FIG. 6 is illustrated.

The second end 710*b* of the first connection bus bar 711 projects from the upper surface 721*e*. The second end 710*b* of the first connection bus bar 711 is spaced from the second end 710*b* of the fifth connection bus bar 715 in the X direction. Thus, in a direction from the left surface 721*a* toward the right surface 721*b*, the second ends 710*b* of the seven connection bus bars 711 to 717 are arranged in an order of the first connection bus bar 711, the fifth connection bus bar 715, the sixth connection bus bar 716, the seventh connection bus bar 717, the second connection bus bar 712, the third connection bus bar 713 and the fourth connection bus bar 714. However, the second end 710*b* of the first connection bus bar 711 is separated from the second ends 710*b* of the other six connection bus bars 712 to 717 in the Y direction.

As described above, the middle portion of the first connection bus bar 711 partly extends in the X direction to have the extending portion 711*b*. The extending portion 711*b* extending in the X direction is separated in the Z direction from the middle portions of the fifth to seventh connection bus bars 715 to 717 connected to the second MG 402. As described above, the extending portion 711*b* of the first connection bus bar 711 extending in the X direction and the middle portions of the fifth to seventh connection bus bars 715 to 717 extending in the Y direction are in twisted positions.

In the following descriptions, in order to simplify the notation, the middle portions of the first to seventh connecting bus bars 711 to 717, which are insert-molded in the terminal block 720, are indicated as first to seventh embedded portions 711*a* to 717*a*, as necessary.

As shown in FIGS. 7 and 8, an interlock pin 724 is insert-molded in the base portion 721. The interlock pin 724 is for determining whether or not a protection cover (not shown) is attached to the sensor unit 700.

A first end of the interlock pin 724 projects from the rear surface 721*d* of the base portion 721. A connection pin of the protection cover is connected to the first end of the interlock pin 724. A second end of the interlock pin 724 projects from the upper surface 721*e* of the base portion 721. The second end of the interlock pin 724 is connected to the sensor substrate 738. A signal indicating the connection state between the interlock pin 724 and the connection pin is provided to the MG-ECU of the control circuit board 372 via the sensor substrate 738 and the output pin 723*a*, as a signal indicating the attachment state of the protection cover and the sensor unit 700.

As shown in FIG. 8, the upper surface 721*e* of the base portion 721 is formed with a plurality of recesses 721*g*. The recesses 721*g* are locally recessed in the z direction from the upper surface 721*e*. The base portion 721 has seven recesses 721*g*. These seven recesses 721*g* are arranged in the X direction in a manner of being spaced from each other in the X direction. These seven recesses 721*g* are arranged in a manner to face the first to seventh embedded portions 711*a* to 717*a* in the Z direction.

The current sensor 730 is provided above the upper surface 721*e*. The sensor substrate 738 is arrange such that a lower main surface 738*a* of the sensor substrate 738 faces the upper surface 721*e* of the base portion 721 in the Z direction. The first to seventh magneto-electric conversion devices 731 to 737 are mounted on the lower main surface 738*a*. The first to seventh magneto-electric conversion devices 731 to 737 are correspondingly located in hollows provided by the above-mentioned seven recesses 721*g*.

A protrusion 721*h* protruding in the Z direction is formed between adjacent two recesses 721*g* on the upper surface 721*e*, which are spaced apart in the X direction. The sensor substrate 738 is formed with through holes that penetrate through the sensor substrate 738 from the lower main surface 738*a* to an upper main surface 738*b* opposite to the lower main surface 738*a*. The protrusions 721*h* are received in the through holes of the sensor substrate 738. The tip ends of the protrusions 721*h* are thermally crimped. Further, the sensor substrate 738 is formed with bolt holes for allowing bolts to pass through. The sensor substrate 738 is fixed to the base portion 721 by the bolts passed through the bolt holes. The sensor substrate 738 is fixed to the base portion 721 by the connection described above. The relative positions of the seven magneto-electric conversion devices 731 to 737 with respect to the seven connection bus bars 711 to 717 are determined.

Current Sensor

As described above, the current sensor 730 has the first to seventh magneto-electric conversion devices 731 to 737. These seven magneto-electric conversion devices 731 to 737 include a plurality of magneto-resistive elements whose resistance values vary according to magnetic fields (transmitted magnetic fields) that permeate the respective units. The resistance value of the magneto-resistive element changes according to components of the transmitted magnetic field along the lower main surface 738a. That is, the resistance value of the magneto-resistive element changes according to the component of the transmitted magnetic field along the X direction and the component along the Y direction.

On the other hand, the resistance value of the magneto-resistive element does not change due to the transmitted magnetic field in the Z direction. Therefore, even when an external noise along the Z direction passes through the magneto-resistive element, the resistance value of the magneto-resistive element does not change.

The magneto-resistive element has a pinned layer having a fixed magnetization direction, a free layer whose magnetization direction changes according to a transmitted magnetic field, and a nonmagnetic intermediate layer arranged between two layers. When the intermediate layer has non-conductivity, the magneto-resistive element is defined as a giant magneto-resistive element.

When the intermediate layer has conductivity, the magneto-resistive element is defined as a tunnel magneto-resistive element. The magneto-resistive element may be an anisotropic magneto-resistance effect element (AMR). Alternatively, the magneto-electric conversion device may have a Hall element instead of the magneto-resistive element.

The resistance value of the magneto-resistive element changes depending on the angle between the magnetization directions of the pinned layer and the free layer. The magnetization direction of the pinned layer is a direction facing in the Z direction. The magnetization direction of the free layer is determined by the component of the transmitted magnetic field along the direction facing in the Z direction. The resistance value of the magneto-resistive element becomes minimum when the magnetization directions of the free layer and the fixed layer are parallel to each other. The resistance value of the magneto-resistive element becomes maximum when the magnetization directions of the free layer and the fixed layer are antiparallel to each other.

Each of the seven magneto-electric conversion devices 731 to 733 has a bridge circuit including a first magneto-resistive element and a second magneto-resistive element in which the magnetization directions of the pinned layers are reversed. Further, either the seven magneto-electric conversion devices 731 to 737 or the sensor substrate 738 has a differential amplifier, a feedback coil, and a shunt resistor.

The bridge circuit is connected to an inverting input terminal and a non-inverting input terminal of the differential amplifier. The feedback coil and the shunt resistor are connected in series to the output terminal of the differential amplifier. The differential amplifier is virtually shorted by a feedback circuit (not shown).

In the connection configuration described above, a current corresponding to the transmitted magnetic field flows through the input terminals of the differential amplifier. The differential amplifier operates so that the inverting input terminal and the non-inverting input terminal have the same potential. That is, the differential amplifier operates so that the current flowing through the input terminal and the current flowing through the output terminal become zero. As a result, a current (i.e., a feedback current) flows from the output terminal of the differential amplifier according to the transmitted magnetic field.

This feedback current flows through the feedback coil and the shunt resistor. Due to the flow of this feedback current, a canceling magnetic field is generated in the feedback coil. This canceling magnetic field passes through the magneto-electric conversion device. Thus, the measurement magnetic field to be measured and passing through the magneto-electric conversion device is cancelled. As described above, the magneto-electric conversion device operates so that the measurement magnetic field passing through the magneto-electric conversion device and the cancellation magnetic field are balanced.

A feedback voltage corresponding to the amount of the feedback current generating the canceling magnetic field is caused at the midpoint between the feedback coil and the shunt resistor. This feedback voltage is input, as an electric signal detecting the measurement current, to the MG-ECU of the control circuit board 372 via the output pin 723a.

As described above, each of the first to seventh magneto-electric conversion devices 731 to 737 is mounted on the lower main surface 738a of the sensor substrate 738. The first to seventh magneto-electric conversion devices 731 to 737 are arranged side by side in the X direction and are spaced from each other in the X direction. Specifically, in the X direction from the left surface 721a toward the right surface 721b, the first to seventh magneto-electric conversion devices 731 to 737 are arranged in an order of the fifth magneto-electric conversion device 735, the sixth magneto-electric conversion device 736, the seventh magneto-electric conversion device 737, the first magneto-electric conversion device 731, the second magneto-electric conversion device 732, and the third magneto-electric conversion device 733, and the fourth magneto-electric conversion device 734.

The fifth to seventh magneto-electric conversion devices 735 to 737 are arranged to correspondingly face the fifth to seventh embedded portions 715a, 716a, and 717a in the Z direction. Therefore, the magnetic field generated from the alternating current flowing through the second MG 402 transmits through the first to seventh magneto-electric conversion devices 735 to 737. The fifth to seventh magneto-electric conversion devices 735 to 737 detect the alternating current flowing through the second MG 402.

The first magneto-electric conversion device 731 is arranged so as to face, in the Z direction, the portion of the first embedded portion 711a extending in the Y direction. Therefore, the magnetic field generated from the direct current flowing through the converter 310 is transmitted through the first magneto-electric conversion device 731. The first magneto-electric conversion device 731 detects a direct current flowing through the converter 310.

The second to fourth magneto-electric conversion devices 732 to 734 are arranged to correspondingly face the second to fourth embedded portions 712a to 714a in the Z direction. Therefore, the magnetic field generated from the alternating current flowing through the first MG 401 transmits through the second to fourth magneto-electric conversion devices 732 to 734. The second to fourth magneto-electric conversion devices 732 to 734 detect the alternating current flowing through the first MG 401.

The alternating current and the direct current detected by the first to seventh magneto-electric conversion devices 731 to 737 are input to the control circuit board 372. The MG-ECU provided on the control circuit board 372 vector-controls the motor 400 based on the detected alternating current, the rotation angle of the motor 400 detected by a rotation angle sensor (not shown), and the like. In addition, the MG-ECU outputs the detected direct current to another ECU such as the battery ECU.

Shield

As described above, the shield 740 includes the first to seventh shield members 741 to 747. The first to seventh members 741 to 747 each have a thin plate shape having a thickness in the Z direction. The first to seventh shield members 741 to 747 are insert-molded in the base portion 721. The first to seventh shield members 741 to 747 are arranged in the X direction, but are spaced from each other in the X direction. The first to seventh shield members 741 to 747 are arranged so as to face the first to seventh embedded portions 711a to 717a in the Z direction. The first to seventh shield members 741 to 747 allow components of the magnetic field in the Z direction to easily transmit.

Resin Cover

The resin cover 750 has a covering portion 751 and a supporting portion 752, which are described in detail. The covering portion 751 and the supporting portion 752 are integrally connected by the resin material forming the resin cover 750.

The covering portion 751 has a substantially rectangular parallelepiped shape with the longitudinal direction in the X direction. The covering portion 751 has an inner surface 751a and an outer surface 751b facing in the Z direction. The resin cover 750 is provided adjacent to the upper surface 721e of the base portion 721 such that the inner surface 751a faces the sensor substrate 738 in the Z direction. The resin cover 750 is fixed to the base portion 721 with bolts 753.

As shown in FIGS. 7 and 8, the supporting portion 752 is integrally connected to the outer surface 751b. The supporting portion 752 extends in the Z direction to separate from the outer surface 751b.

The resin cover 750 has a through hole defining a hollow in the Z direction, in the supporting portion 752 and a connecting portion of the covering portion 751 with the supporting portion 752. The second end 710b of the first connection bus bar 711 protruding from the front surface 721c of the base portion 721 is inserted into this hollow. The second end 710b of the first connection bus bar 711 is exposed from an end surface 752a of the supporting portion 752.

A nut 752b opening in the Z direction is insert-molded at the end surface 752a of the supporting portion 752. The second end 710b of the first connection bus bar 711 is bent so as to face the nut 752b in the Z direction. A bolt is fastened to the nut 752b such that the second end of the A-phase reactor 313 contacts the second end 710b of the first connection bus bar 711. As a result, the first connection bus bar 711 and the A-phase reactor 313 are electrically connected to each other.

Opposing Shield

As described above, the opposing shield 760 includes the first to seventh opposing shield members 761 to 767. The first to seventh opposing shield members 761 to 767 each have a thin plate shape having a thickness in the Z direction. The first to seventh opposing shield members 761 to 767 are insert-molded in the resin cover 750. The first to seventh opposing shield members 761 to 767 are arranged in the X direction, and are spaced from each other in the X direction. The first to seventh opposing shield members 761 to 767 allow components of the magnetic field in the Z direction to easily transmit.

In the state where the resin cover 750 is fixed to the base portion 721 with the bolts 753, the first to seventh opposing shield members 761 to 767 are correspondingly opposed to the first to seventh shield members 741 to 747 in the Z direction. The first to seventh embedded portions 711a to 717a and the first to seventh magneto-electric conversion devices 731 to 737 are located between the first to seventh opposing shield members 761 to 767 and the first to seventh shield members 741 to 747.

Specifically, in the Z direction, the fifth embedded portion 715a and the fifth magneto-electric conversion device 735 are located between the fifth shield member 745 and the fifth opposing shield member 765. The sixth embedded portion 716a and the sixth magneto-electric conversion device 736 are located between the sixth shield member 746 and the sixth opposing shield member 766. The seventh embedded portion 717a and the seventh magneto-electric conversion device 737 are located between the seventh shield member 747 and the seventh opposing shield member 767.

In the Z direction, the portion of the first embedded portion 711a extending in the Y direction and the first magneto-electric conversion device 731 are located between the first shield member 741 and the first opposing shield member 761.

In the Z direction, the second embedded portion 712a and the second magneto-electric conversion device 732 are located between the second shield member 742 and the second opposing shield member 762. The third embedded portion 713a and the third magneto-electric conversion device 733 are located between the third shield member 743 and the third opposing shield member 763. The fourth embedded portion 714a and the fourth magneto-electric conversion device 734 are located between the fourth shield member 744 and the fourth opposing shield member 764.

Cancellation of Magnetic Field

Next, the cancellation of the magnetic field that tends to pass through the magneto-electric conversion device will be described with reference to FIG. 4. In FIG. 4, among the seven connection bus bars 711 to 717, the seven magneto-electric conversion devices 731 to 737, the seven shield members 741 to 747 and the seven opposing shield members 761 to 767, the second connection bus bar 712, the second magneto-electric conversion device 732, the second shield member 742, and the second opposing shield member 762 are exemplarily shown. The third to seventh connection bus bars 713 to 717, the third to seventh magneto-electric conversion devices 733 to 737, the third to seventh shield members 743 to 747 and the third to seventh opposing shield members 763 to 767, respectively, have the similar configurations to those of the second connection bus bar 712, the second magneto-electric conversion device 732, the second shield member 742 and the second opposing shield member 762 shown in FIG. 4.

The second to seventh connection bus bars 712 to 717 correspond to a bus bar. The second to seventh magneto-electric conversion devices 732 to 737 correspond to a magneto-electric conversion device. The midpoint terminal 330c corresponds to a switch terminal. The stator bus bar 420 corresponds to a motor terminal.

In the following, for simplification of the descriptions, a direction from the connection bus bar toward the magneto-electric conversion device along the Z direction is referred to as an upward direction, and a direction from the magneto-electric conversion device toward the connection bus bar along the Z direction is referred to as a downward direction. The upward direction may also be referred to as a first direction, and the downward direction may also be referred to as a second direction.

As shown in FIG. 4, the midpoint terminal 330c extends in the upward direction toward the first end 710a of the second connection bus bar 712. In other words, the midpoint terminal 330c extends in the downward direction to be away from the first end 710a of the second connection bus bar 712.

The tip end of the midpoint terminal 330c and the first end 710a of the second connection bus bar 712 are arranged in the X direction and are in contact with each other in the X direction. Laser is irradiated downward toward a contact portion between the midpoint terminal 330c and the first end 710a of the second connection bus bar 712. As a result, the midpoint terminal 330c and the first end 710a of the second connection bus bar 712 are welded and joined to each other.

The connecting portion of the stator bus bar 420, which is fastened with the second connection bus bar 712 with the bolt, extends upward to be away from the second end 710b of the second connection bus bar 712. In other words, the connecting portion of the stator bus bar 420, which is fastened with the second connection bus bar 712 with the bolt, extends downwardly toward the second end 710b of the second connection bus bar 712.

The stator bus bar 420 and the second end 710b of the second connection bus bar 712 are arranged side by side in the Y direction, and are in contact with each other in the Y direction. The connecting portion of the stator bus bar 420 and the second end 710b of the second connection bus bar 712, which are opposed to each other in the Y direction, are respectively formed with holes to allow the bolt 430. The stator bus bar 420 and the second connection bus bar 712 are joined to each other by fastening the bolt 430. Thus, as shown in FIG. 4, the midpoint terminal 330c and the stator bus bar 420 are substantially disposed on opposite sides of the middle portion of the second connection bus bar 712 in the Z direction.

Since the midpoint terminal 330c and the stator bus bar 420 are extended and joined with the second connection bus bar 712 in the manner as described above, a current flows from the midpoint terminal 330c toward the stator bus bar 420 via the second connection bus bar 712, as shown by solid arrows in FIG. 4. In this case, the current flows upwardly in the midpoint terminal 330c. Also, the current flows upwardly in the stator bus bar 420.

Conversely, when a current flows from the stator bus bar 420 toward the midpoint terminal 330c via the second connection bus bar 712, the current flows downwardly in the midpoint terminal 330c. Also, the current flows downwardly in the stator bus bar 420.

A magnetic field is generated from the current flowing through each of the midpoint terminal 330c and the stator bus bar 420 described above. The magnetic fields tend to pass through the second magneto-electric conversion device 732 located between the midpoint terminal 330c and the stator bus bar 420 in the Y direction.

However, as described above, the flow directions of the currents flowing through the midpoint terminal 330c and the stator bus bar 420 are the same. Therefore, the magnetic field caused by the current flowing through the midpoint terminal 330c and the magnetic field caused by the current flowing through the stator bus bar 420 cancel out each other. These two magnetic fields cancel each other at the second magneto-electric conversion device 732 located between the midpoint terminal 330c and the stator bus bar 420. Therefore, it is less likely that the current detection accuracy of the second magneto-electric conversion device 732 will be degraded due to the magnetic fields generated from the midpoint terminal 330c and the stator bus bar 420.

In addition, the length of the stator bus bar 420 in the Z direction is greater than the length of the midpoint terminal 330c in the Z direction, as shown in FIG. 4. In this case, a larger magnetic field is more likely to be generated from the stator bus bar 420 than from the midpoint terminal 330c. However, the magnetic field has the property of weakening with an increase in distance from the source.

Therefore, the second magneto-electric conversion device 732 is located closer to the midpoint terminal 330c than the stator bus bar 420 in the Y direction. In FIG. 4, a one-dot chain line BL indicates a reference line passing through a midpoint between the midpoint terminal 330c and the stator bus bar 420 in the Z direction. The second magneto-electric conversion device 732 is located between the midpoint terminal 330c and the reference line BL in the Y direction.

As such, the magnetic fields generated from the midpoint terminal 330c and the stator bus bar 420 are effectively canceled at the second magneto-electric conversion device 732. Accordingly, the degradation of the current detection accuracy of the second magneto-electric conversion device 732 can be effectively suppressed. The similar effects can also be achieved in the third to seventh magneto-electric conversion devices 733 to 737.

As shown in FIG. 4, in the direction connecting the cooler 370 and the terminal block 720, a part of the connection bus bar is located between the cooler 370 and the terminal block 720. The part of the connection bus bar is located between the switch module accommodated in the cooler 370 and the current sensor 730 provided on the terminal block 720.

In the above-described configuration, it is possible to suppress radiant heat of the switch module from being transferred to the first to seventh magneto-electric conversion devices 731 to 737 of the current sensor 730. As a result, the temperature rise of the magneto-electric conversion device is suppressed. Further, the change in characteristics of the magneto-electric conversion device due to the temperature rise is suppressed. Furthermore, the degradation of the detection accuracy of the magneto-electric conversion device is suppressed.

While the selected exemplary embodiment has been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment according to the present disclosure is provided for illustration only, and not for the purpose of limiting the disclosure as defined by the appended claims and their equivalents.

First Modification

Figure 9:
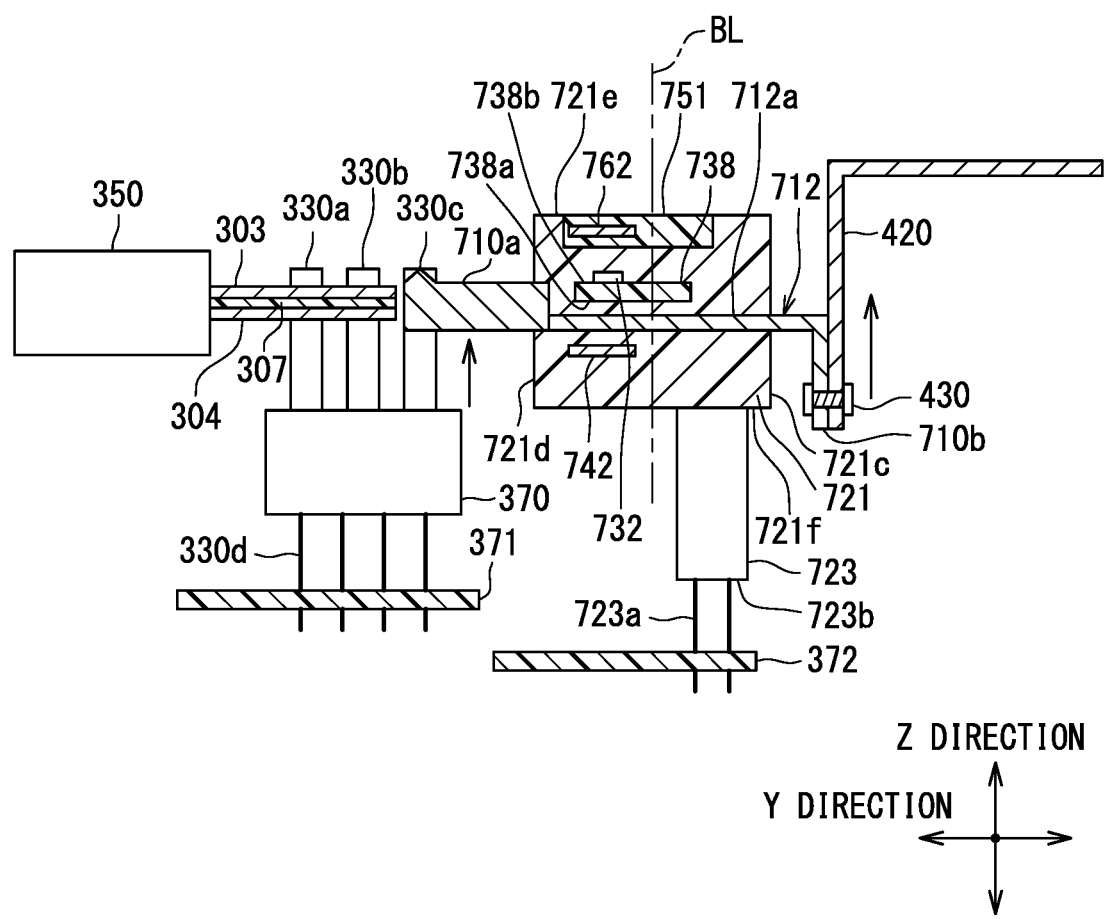
FIG. 9 is a schematic diagram illustrating modifications of the electrical connection of the power conversion apparatus.

In the first embodiment described above, the first to seventh magneto-electric conversion devices 731 to 737 are exemplarily mounted on the lower main surface 738a of the sensor substrate 738. As a first modification, the first to seventh magneto-electric conversion devices 731 to 737 may be mounted on the upper main surface 738b of the sensor substrate 738. FIG. 9 shows a configuration in which the second magneto-electric conversion device 732 is mounted on the upper main surface 738b.

In such a configuration, the first to seventh magneto-electric conversion devices 731 to 737 are separated from the driver board 371 and the control circuit board 372 in the Z direction. In addition, the first to seventh magneto-electric conversion devices 731 to 737 are separated from the cooler (power module) 370 accommodating the switch modules therein in the Z direction. Therefore, electromagnetic noise generated from each of the driver board 371, the control circuit board 372, and the power module is suppressed from passing through the first to seventh magneto-electric conversion devices 731 to 737. As such, the degradation of the current detection accuracy can be suppressed. Furthermore, the transferring of the radiant heat of the power module to the first to seventh magneto-electric conversion devices 731 to 737 is suppressed. As a result, the change in characteristics of the first to seventh magneto-electric conversion devices 731 to 7373 and the degradation of the current detection accuracy due to the temperature rise are suppressed.

Second Modification

In the first embodiment described above, the second end 710*b* of each of the second to seventh connection bus bars 712 to 717 exemplarily projects from the front surface 721*c* in the Y direction so as to separate from the front surface 721*c*, and then bends upwardly in the Z direction to extend from the lower surface 721*f* toward the upper surface 721*e*. As a second modification, the second ends 710*b* of the second to seventh connection bus bars 712 to 717 may project from the front surface 721*c* in the Y direction so as to separate from the front surface 721*c*, and then bend to extend downwardly in the Z direction from the upper surface 721*e* toward the lower surface 721*f*, as shown in FIG. 9, for example.

Third Modification

In the first embodiment described above, the driver board 371 and the control circuit board 372 are located adjacent to the lower surface 721*f* of the base portion 721 in the Z direction, as shown in FIG. 4. As third modifications, the driver board 371 may be located adjacent to the upper surface 721*e* and the control circuit board 372 may be located adjacent to the lower surface 721*f* in the Z direction, as shown in FIGS. 10 and 11.

In such modifications, the midpoint terminal 330*c* extends downwardly toward the first end 710*a* of the second connection bus bar 712. The connecting portion of the stator bus bar 420, which is connected to the second connection bus bar 712 with the bolt 430, extends downwardly so as to separate from the second end 710*b* of the second connection bus bar 712.

Figure 10:
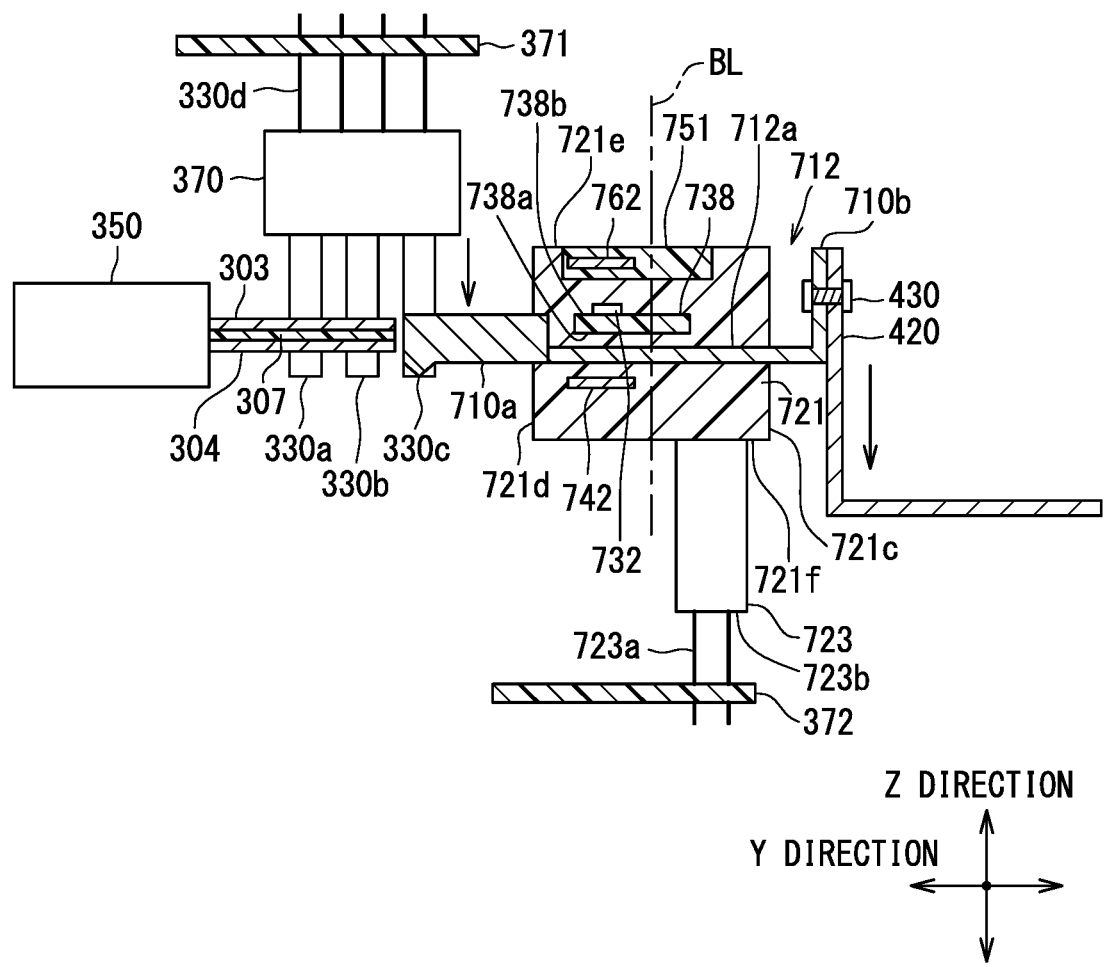
FIG. 10 is a schematic diagram illustrating a modification of the electrical connection of the power conversion apparatus.
Figure 11:
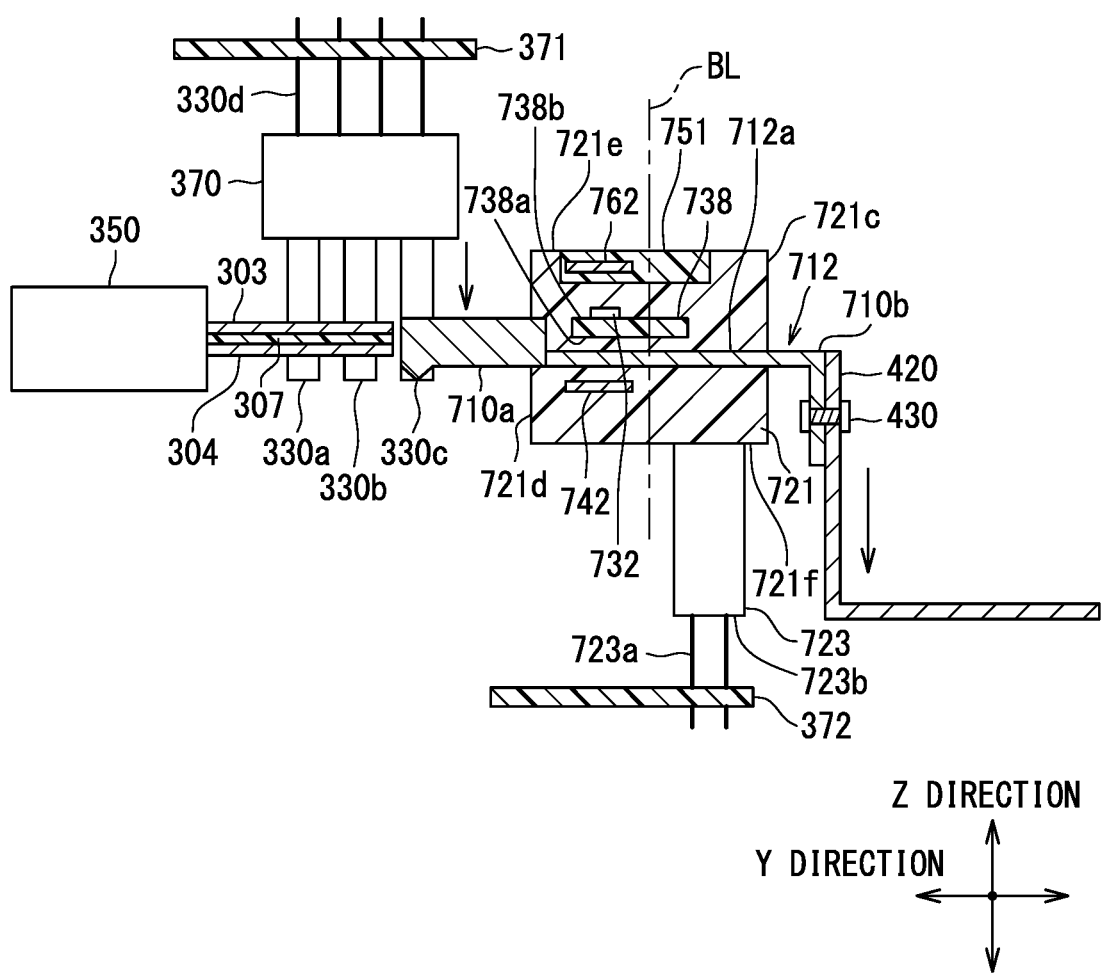
FIG. 11 is a schematic diagram illustrating a modification of the electrical connection of the power conversion apparatus.

In the modification shown in FIG. 10, the second end 710*b* of the second connection bus bar 712 projects from the front surface 721*c* in the Y direction so as to separate from the front surface 721*c*, and then bends upwardly to extend in the Z direction from the lower surface 721*f* toward the upper surface 721*e*. In the modification shown in FIG. 11, the second end 710*b* of the second connection bus bar 712 projects from the front surface 721*c* in the Y direction so as to separate from the front surface 721*c*, and then bends downwardly to extend in the Z direction from the upper surface 721*e* toward the lower surface 721*f*.

Fourth Modification

Figure 12:
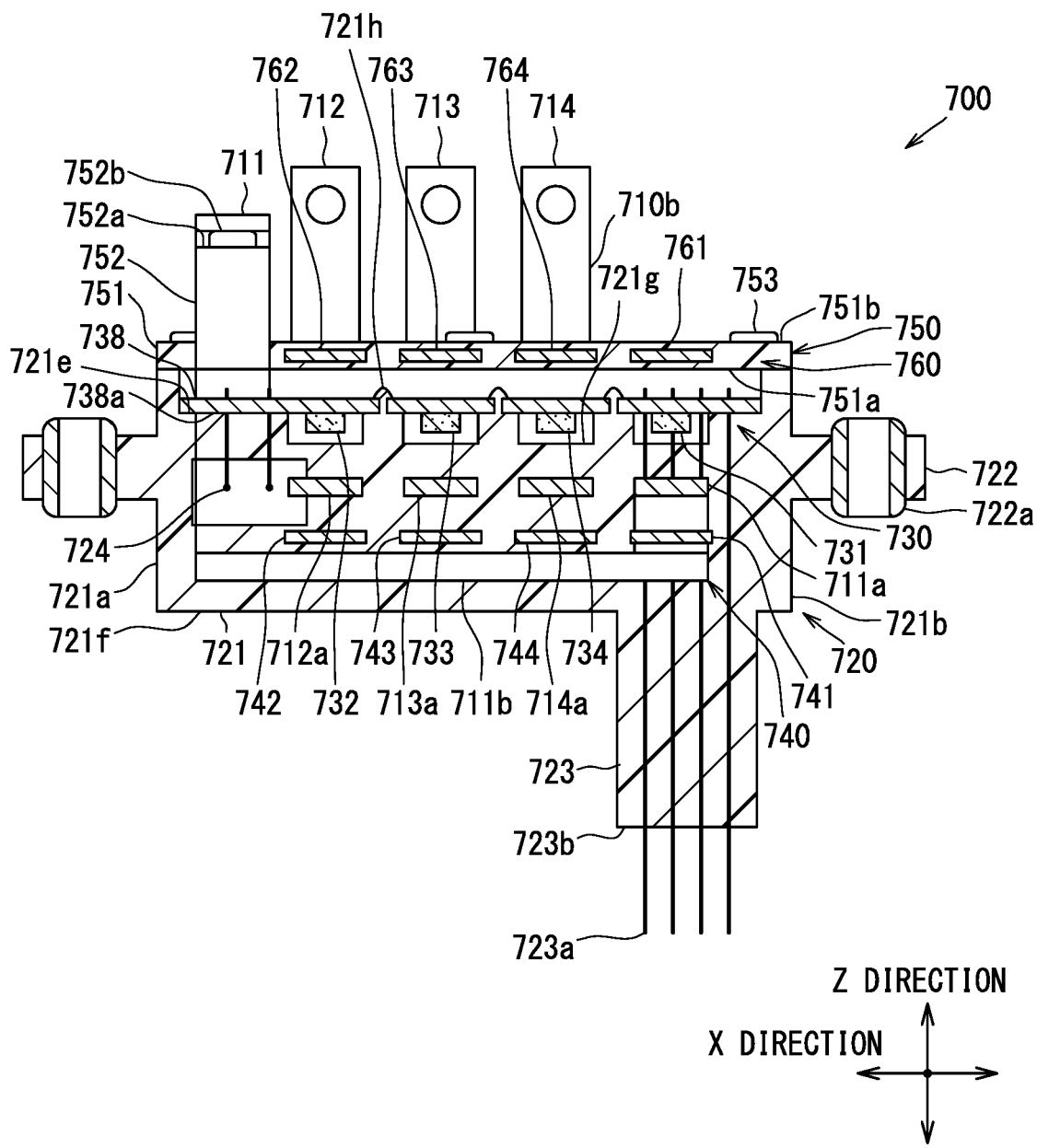
FIG. 12 is a diagram illustrating a cross-sectional view of a modification of the sensor unit.

In the first embodiment described above, the inverter 320 exemplarily has the six switch modules, that is, the U- to Z-phase switch modules 322 to 327. As a fourth modification, the inverter 320 may have three switch modules, for example, the U- to W-phase switch modules 322 to 324. In such a case, as shown in FIG. 12, the sensor unit 700 has four connection bus bars 711 to 714.

Fifth Modification

Figure 13:
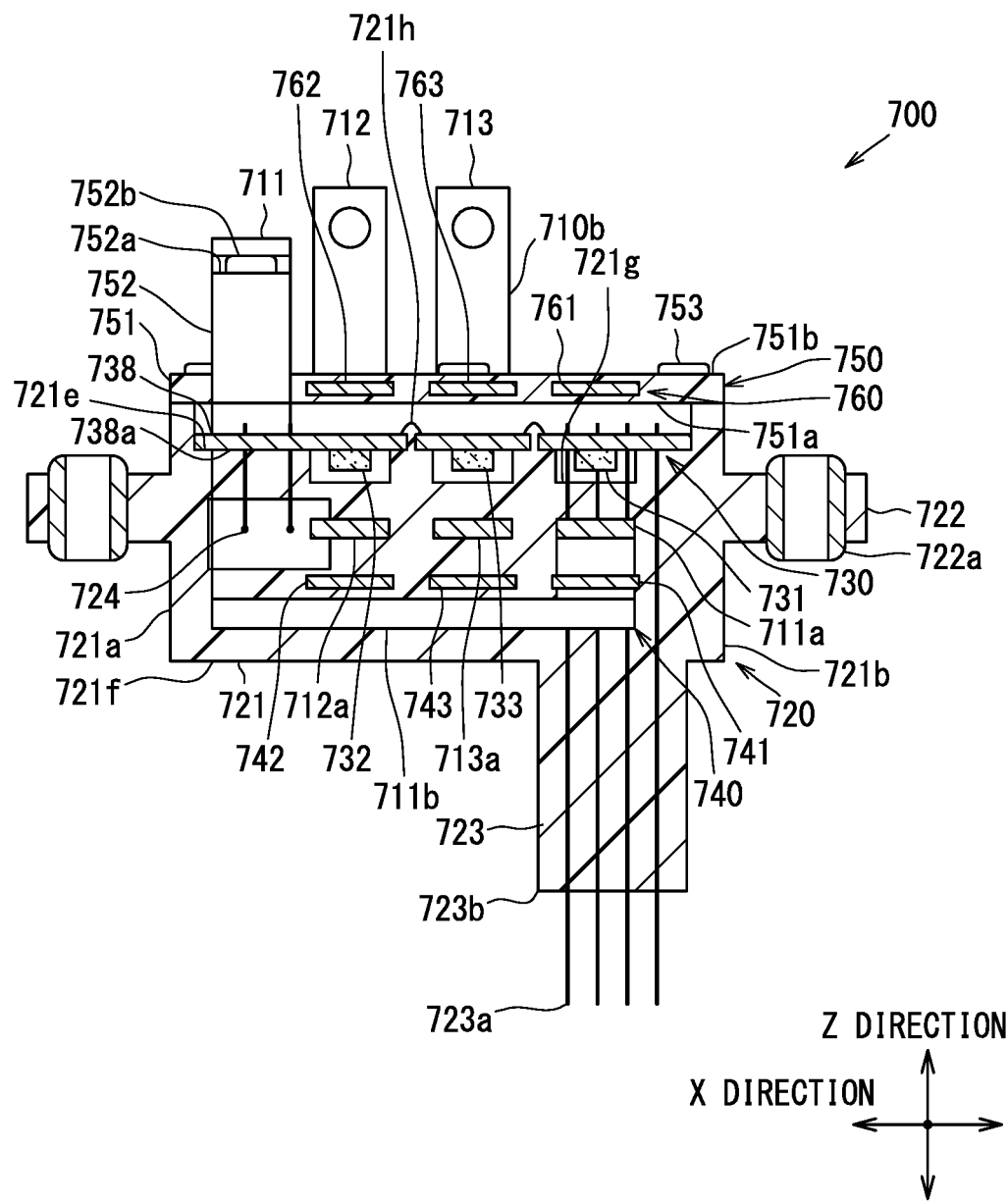
FIG. 13 is a diagram illustrating a cross-sectional view of a modification of the sensor unit.

In the first embodiment described above, the power conversion apparatus 300 exemplarily has the converter 310 and the inverter 320. As a fifth modification, the power conversion apparatus 300 may only have the inverter 320, as shown in FIG. 13. In such a modification, the sensor unit 700 has three connection bus bars 711 to 713.

Sixth Modification

In the first embodiment described above, the shield 740 and the opposing shield 760 each have the thin plate shape having the thickness in the Z direction. However, the shape of the shield is not particularly limited. For example, the shield 740 and the opposing shield 760 may each have a shape including a first thin plate portion having the thickness in the Z direction, and side plate portions extending, in the Z direction, from opposite ends of the first thin plate portion in the X direction. In such a case, when the ends of the side plate portions of the shield 740 and the opposing shield 760 are opposed to each other in the Z direction, the magneto-electric conversion device and the embedded portion can be surrounded by the shield 740 and the opposing shield 760. Furthermore, the sensor unit 700 may have either the shield 740 or the opposing shield 760.

Seventh Modification

In the first embodiment described above, the converter 310 exemplarily has the A-phase switch module 312. As a modification, the converter 310 may have switch modules of multiple phases. In such a case, the first end 710*a* of the first connection bus bar 711 is branched into multiple portions corresponding to the number of the phases of the switch modules. For example, in a case where the converter 310 includes switch modules of two phases, the first end 710*a* of the first connection bus bar 711 is branched into two portions. In a case where the converter 310 includes switch modules of three phases, the first end 710*a* of the first connection bus bar 711 is branched into three portions.

Furthermore, the switch modules of the six phases of the inverter 320 may each have a plurality of high-side switches 331 and a plurality of low-side switches 332. In such a case, the first end 710*a* of each of the second to seventh connection bus bars 712 to 717 is branched into multiple portions corresponding to the number of the high-side switches 331. For example, in a case where the switch modules of the six phases each have two high-side switches 331 and two low-side switches 332, the first end 710*a* of each of the second to seventh connection bus bars 712 to 717 is branched into two portions. In a case where the switch modules of the six phases each has three high-side switches 331 and three low-side switches 332, the first end 710*a* of each of the second to seventh connection bus bars 712 to 717 is branched into three portions.

Other Modifications

In each of the embodiment and modifications, the power conversion apparatus 300 including the sensor unit 700 is exemplarily employed to the in-vehicle system 100 constituting the hybrid system. However, the application of the power conversion apparatus 300 may not be limited to the above-described example. For example, the power conversion apparatus 300 may be applied to an in-vehicle system of an electric vehicle.

What is claimed is:

1. A sensor unit comprising:
   a bus bar connecting a plurality of switch elements constituting a part of a power conversion circuit and a motor, the bus bar having a first end, a second end and a middle portion between the first end and the second end; and a magneto-electric conversion device arranged to face the middle portion of the bus bar across a space in a predetermined direction, and being configured to detect a magnetic field caused from an electric current flowing in the bus bar to thereby detect the electric current flowing in the bus bar, wherein the first end of the bus bar is connected to one of a switch terminal extending from the switch elements and a motor terminal extending from the motor, the second end of the bus bar is connected to the other of the switch terminal and the motor terminal, the magneto-electric conversion device is located between the switch terminal and the motor terminal in a lateral direction orthogonal to the predetermined direction, the predetermined direction including a first direction and a second direction opposite to each other, the first direction being from the middle portion of the bus bar toward the magneto-electric conversion device and the second direction being from the magneto-electric conversion device toward the middle portion of the bus bar, the one of the switch terminal and the motor terminal extends in the first direction to connect to the first end of the bus bar, and the other of the switch terminal and the motor terminal extends in the second direction to connect to the second end of the bus bar.

2. The sensor unit according to claim 1, wherein
the motor terminal is longer than the switch terminal in the predetermined direction, and
the magneto-electric conversion device is located closer to the switch terminal than the motor terminal.

3. The sensor unit according to claim 1, further comprising:
a sensor substrate having the magneto-electric conversion device thereon, wherein
the sensor substrate is spaced from the plurality of switch elements in the predetermined direction,
the sensor substrate has a first surface adjacent to the plurality of switch elements and a second surface opposite to the first surface in the predetermined direction, and
the magneto-electric conversion device is mounted on the second surface of the sensor substrate.

4. The sensor unit according to claim 3, further comprising:
a control board that controls on and off of the plurality of switch elements, wherein
the control board is located closer to the first surface of the sensor substrate than the second surface of the sensor substrate in the predetermined direction.

5. The sensor unit according to claim 1, wherein
the switch terminal extends in the first direction to connect to the first end of the bus bar,
the motor terminal extends in the second direction to connect to the second end of the bus bar, and
the bus bar is partly located between the switch elements and the magneto-electric conversion device in a direction passing through the switch elements and the magneto-electric conversion device.

6. The sensor unit according to claim 1, further comprising:
a terminal block made of resin, wherein
the middle portion of the bus bar and the magneto-electric conversion device are disposed in the terminal block,
the first end of the bus bar projects from a first surface of the terminal block in the lateral direction,
the second end of the bus bar projects from a second surface of the terminal block in the lateral direction, the second surface being opposite to the first surface in the lateral direction,
the switch terminal extends in the first direction and connects to the first end of the bus bar,
the motor terminal extends in the second direction and connects to the second end of the bus bar, and
the switch terminal and the motor terminal are disposed on opposite sides of the middle portion of the bus bar in the predetermined direction.

\* \* \* \* \*